(12) United States Patent
Okada

(10) Patent No.: US 8,174,087 B2
(45) Date of Patent: May 8, 2012

(54) ELECTROMAGNECTIC WAVE DETECTING ELEMENT

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 325 days.

(21) Appl. No.: 12/320,225

(22) Filed: Jan. 22, 2009

(65) Prior Publication Data

US 2009/0189231 A1    Jul. 30, 2009

(30) Foreign Application Priority Data

Jan. 29, 2008  (JP) ................. 2008-017743
Mar. 31, 2008  (JP) ................. 2008-093858
Aug. 15, 2008  (JP) ................. 2008-209179

(51) Int. Cl.
*H01L 31/06* (2012.01)

(52) U.S. Cl. ........ 257/443; 257/447; 257/431; 257/448; 257/452; 257/457; 257/461; 257/462

(58) Field of Classification Search .................. 257/431, 257/443, 447, 448, 452, 457, 461, 462, E33.001
See application file for complete search history.

(56) References Cited

U.S. PATENT DOCUMENTS 5,777,355 A    7/1998   Possin et al.

2005/0184244 A1 *  8/2005   Yoshimuta et al. ...... 250/370.01
2008/0099869 A1 *  5/2008   Izumi .......................... 257/443

FOREIGN PATENT DOCUMENTS

| DE | 10 2006 056995 A1 | 5/2007 |
| EP | 0964451 A2 | 12/1999 |
| EP | 1179852 A2 | 2/2002 |
| JP | A 2000-137080 | 5/2000 |

* cited by examiner

*Primary Examiner* — Michael Shingleton
(74) *Attorney, Agent, or Firm* — SOLARIS Intellectual Property Group, PLLC

(57) ABSTRACT

The present invention is to provide an electromagnetic wave detecting element that can prevent a decrease in light utilization efficiency at sensor portions. The sensor portions are provided so as to correspond to respective intersection portions of scan lines and signal lines, and have semiconductor layer that generate charges due to electromagnetic waves being irradiated, and at whose electromagnetic wave irradiation surface sides upper electrodes are formed, and at whose electromagnetic wave non-irradiation surface sides lower electrodes are formed. Bias voltage is supplied to the respective upper electrodes via respective contact holes by a common electrode line that is formed further toward an electromagnetic wave downstream side than the semiconductor layer.

17 Claims, 23 Drawing Sheets

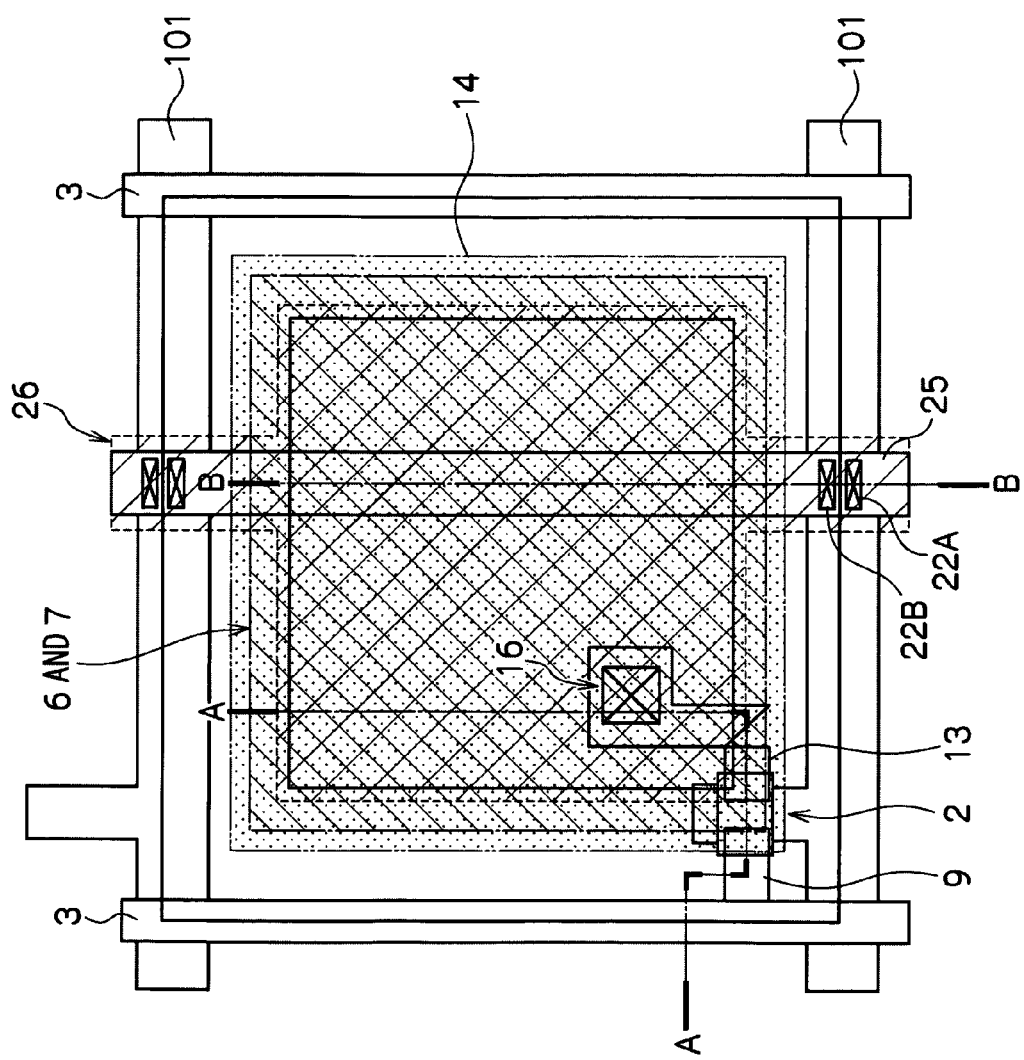

ELECTROMAGNECTIC WAVE DETECTING ELEMENT

CROSS-REFERENCE TO RELATED APPLICATION

This application claims priority under 35 USC 119 from Japanese Patent Application No. 2008-017743, No. 2008-093858 and No. 2008-209179, the disclosure of which is incorporated by reference herein.

BACKGROUND OF THE INVENTION

1. Field of the Invention

The present invention relates to an electromagnetic wave detecting element. In particular, the present invention relates to an electromagnetic wave detecting element that includes a TFT active matrix substrate that detects an image and at which sensor portions are provided in correspondence with intersection portions of plural scan lines and plural signal lines that are disposed so as to intersect one another.

2. Description of the Related Art

Radiation image detection devices such as FPDs (flat panel detectors), in which an X-ray sensitive layer is disposed on a TFT (thin film transistor) active matrix substrate and that converts X-ray information directly into digital data, and the like have been put into practice in recent years. As compared with a conventional imaging plate, an FPD has the advantages that an image can be confirmed immediately and video images as well can be confirmed, and the popularization of FPDs has advanced rapidly.

Various types of such a radiation image detection device have been proposed. For example, there is a direct-conversion-type radiation image detection device that converts radiation directly into charges and accumulates the charges. Moreover, there is an indirect-conversion-type radiation image detection device that once converts radiation into light at a scintillator of CsI:Tl, GOS (Gd2O2S:Tb), or the like, and, at semiconductor layer, converts the converted light into charges and accumulates the charges (see, for example, Japanese Patent Application Laid-Open (JP-A) No. 2000-137080).

As an example, a plan view showing the structure of one pixel unit of an electromagnetic wave detecting element 10' that is used in an indirect-conversion-type radiation image detection device, is shown in FIG. 13. Further, a cross-sectional view along line A-A of FIG. 13 is shown in FIG. 14.

As shown in FIG. 13, sensor portions are provided at the electromagnetic wave detecting element 10', in correspondence with the respective intersection portions of plural scan lines 101' and plural signal lines 3' that are disposed so as to intersect one another.

As shown in FIG. 14, the sensor portion includes: a semiconductor layer 6' at which charges are generated due to light being illuminated; an upper electrode 7' that is formed by a light-transmissive, electrically-conductive member at an illumination surface side of the semiconductor layer 6' at which light is illuminated, and that applies bias voltage to the semiconductor layer 6'; and a lower electrode 14' that is formed at the light non-illumination surface side of the semiconductor layer 6', and collects charges that are generated at the semiconductor layer 6'.

At the electromagnetic wave detecting element 10', common electrode lines 25', that supply bias voltage to the upper electrodes 7', are disposed at the upper layer of the semiconductor layer 6'. The resistance of the common electrode lines 25' must be made to be low in order to supply charges. Therefore, the common electrode lines 25' are formed by using a low-resistance wiring material of Al or Cu, or of mainly Al or Cu.

U.S. Pat. No. 5,777,355 discloses a technique of connecting respective upper electrodes that are formed from transparent, electrically-conductive members, so as to have them function also as common electrode lines.

However, as shown in FIG. 14, if the common electrode lines 25' are disposed at the illumination surface sides of the semiconductor layer 6', light is not illuminated onto the portions of the semiconductor layer 6' beneath the common electrode lines 25', and the efficiency of utilizing light decreases.

Thus, an electromagnetic wave detecting element that, by using the technique disclosed in U.S. Pat. No. 5,777,355, connects the respective upper electrodes 7' that are formed from transparent, electrically-conductive members and causes them to function also as common electrode lines, is considered.

However, usually, the resistivity of a transparent, electrically-conductive member is very large, and is 50 to 200 times that of a low-resistance wiring material. Accordingly, if the upper electrodes 7' are respectively connected and made to function also as common electrode lines, the wiring load (resistance, capacity) of the common electrode lines increases, and the desired response cannot be realized. Therefore, the upper electrodes 7' cannot be respectively connected and made to function also as common electrode lines.

Note that, in the above description, the efficiency of utilization of light is mentioned because light is the object of detection of the semiconductor layer 6'. However, such problems arise as well in cases in which the object of detection is any type of electromagnetic waves such as ultraviolet rays or infrared rays.

SUMMARY OF THE INVENTION

The present invention provides an electromagnetic wave detecting element that, although equipped with a common electrode line, can prevent a decrease in the efficiency of utilizing electromagnetic waves at sensor portions.

A first aspect of the present invention is an electromagnetic wave detecting element that includes: a plurality of sensor portions having: semiconductor layer provided in correspondence with respective intersection portions of a plurality of scan lines and a plurality of signal lines that are disposed so as to intersect one another, the semiconductor layer generating charges by being irradiated by electromagnetic waves expressing an image that is an object of detection, first electrodes formed by electrically-conductive members, that have transmittance with respect to the electromagnetic waves, at irradiation surface sides of the semiconductor layer to which the electromagnetic waves are irradiated, the first electrodes applying bias voltage to the semiconductor layer, and second electrodes formed at non-irradiation surface sides of the semiconductor layer with respect to the electromagnetic waves, the second electrodes collecting the charges that are generated at the semiconductor layer; and a common electrode line formed at an electromagnetic wave downstream side of the sensor portions, and connected to the first electrodes via respective contact holes, and supplying the bias voltage.

In accordance with the above-described aspect, the electromagnetic wave detecting element of the present invention is sensor portions that generate charges due to electromagnetic waves being irradiated. The sensor portions, that have the semiconductor layer at whose electromagnetic wave irradiation surface sides the first electrodes are formed and at whose electromagnetic wave non-irradiation surface sides the second electrodes are formed, are provided in correspondence with the respective intersection portions of the scan lines and the signal lines.

In accordance with the above-described aspect, bias voltage is supplied to the first electrodes via respective contact holes by the common electrode line that is formed further toward the electromagnetic wave downstream side than the sensor portions.

In this way, in the electromagnetic wave detecting element of the present invention of the above-described aspect, the common electrode line that supplies bias voltage to the first electrodes is formed further toward the downstream side of the electromagnetic waves than the sensor portions. Accordingly, shielding of the electromagnetic waves, that are irradiated onto the semiconductor layer, by the common electrode line is eliminated. Therefore, even though the electromagnetic wave detecting element of the present invention of the above-described aspect is provided with a common electrode line, it can prevent a decrease in the efficiency of utilizing electromagnetic waves at the sensor portions.

In a second aspect of the present invention, in the above-described aspect, the common electrode line may have low resistance compared to the electrically-conductive members that form the first electrodes.

In a third aspect of the present invention, in the above-described aspect, the common electrode line may be Al or Cu, or may be an alloy or a layered film including Al or Cu.

In a fourth aspect of the present invention, the above-described aspect may further include: a first insulating film provided between the plurality of sensor portions and the common electrode line and insulating the sensor portions and the common electrode line, the plurality of contact holes being formed in the first insulating film; and a plurality of contacts whose respective one ends are connected to the first electrodes via the contact holes respectively, and whose other ends are connected to the common electrode line.

In a fifth aspect of the present invention, in the above-described aspect, the scan lines may be formed by a wiring layer that is formed at an electromagnetic wave downstream side, via a second insulating film, of a wiring layer at which the common electrode line is formed, and contact holes may be formed in the first insulating film at positions at the irradiation surface sides of regions where the scan lines are formed.

In a sixth aspect of the present invention, in the above-described aspect, the first insulating film may be an interlayer insulating film whose film thickness is greater than or equal to 1 μm. Further, in a seventh aspect of the present invention, in the above-described aspect, the first insulating film may be an interlayer insulating film whose dielectric constant is 2 to 4.

In an eighth aspect of the present invention, the above-described aspect may further include a third insulating film that covers at least outer peripheries of the plurality of sensor portions, and in which a plurality of contact holes are formed, wherein one ends of a plurality of contacts are connected to the first electrodes via the contact holes that are formed in the first insulating film and the third insulating film respectively, and other ends of the plurality of contacts are connected to the common electrode line.

In a ninth aspect of the present invention, in the above-described aspect, the third insulating film may be an interlayer insulating film whose film thickness is thicker than a film thickness of the sensor portions.

In a tenth aspect of the present invention, the above-described aspect may further include a protective insulating film that is formed of an inorganic material and that covers the third insulating film, the contacts, and the first electrodes. Further, in an eleventh aspect of the present invention, the above-described aspect may further include a protective insulating film that is formed of an inorganic material between the first insulating film and the third insulating film.

In a twelfth aspect of the present invention, in the above-described aspect, the protective insulating film may be an SiNx or SiOx film.

In a thirteenth aspect of the present invention, in the above-described aspect, the contacts may be formed from IZO or ITO. Further, in a fourteenth aspect of the present invention, in the above-described aspect, the contacts may be formed of a same member as the first electrodes.

In a fifteenth aspect of the present invention, in the above-described aspect, the first electrodes may be electrically connected via connection regions to other adjacent first electrodes.

In a sixteenth aspect of the present invention, in the above-described aspect, the connection regions may be formed from electrically-conductive members having transmittance with respect to the electromagnetic waves.

In a seventeenth aspect of the present invention, in the above-described aspect, the first electrodes may be connected to other first electrodes that are adjacent along the signal line. Further, in an eighteenth aspect of the present invention, in the above-described aspect, the first electrodes may be connected to other first electrodes that are adjacent along the scan line.

Here, the electromagnetic waves mean electromagnetic waves that are mainly detected at the sensor portions. For example, in the case of an electromagnetic wave detecting element that is used in an indirect-conversion-type radiation image detection device, the light that is emitted by the scintillator corresponds to the electromagnetic waves. Accordingly, the side of the semiconductor layer that faces the scintillator is the electromagnetic wave irradiation surface. On the other hand, the side opposite the scintillator is the electromagnetic wave non-irradiation surface. Further, for the other wiring layers and the like, the scintillator side thereof is called the upstream side, and the opposite side thereof is called the downstream side.

In this way, in accordance with the present invention, the common electrode line, that supplies bias voltage to the first electrodes and that is formed from a light-shielding, low-resistance wiring material, is formed at the electromagnetic wave downstream side of the sensor portions. Accordingly, an electromagnetic wave detecting element can be provided that, although equipped with a common electrode line, can prevent a decrease in the efficiency of utilizing electromagnetic waves at sensor portions.

BRIEF DESCRIPTION OF THE DRAWINGS

Exemplary embodiments of the present invention will be described in detail based on the following figures, wherein:

FIG. 15 is a plan view showing another structure of one pixel unit of the electromagnetic wave detecting element relating to the exemplary embodiment;

DETAILED DESCRIPTION OF THE INVENTION

Exemplary embodiments of the present invention will be described hereinafter with reference to the drawings. Note that, hereinafter, a case will be described in which the present invention is applied to an indirect-conversion-type radiation image detection device 100.

First Exemplary Embodiment

Figure 1:
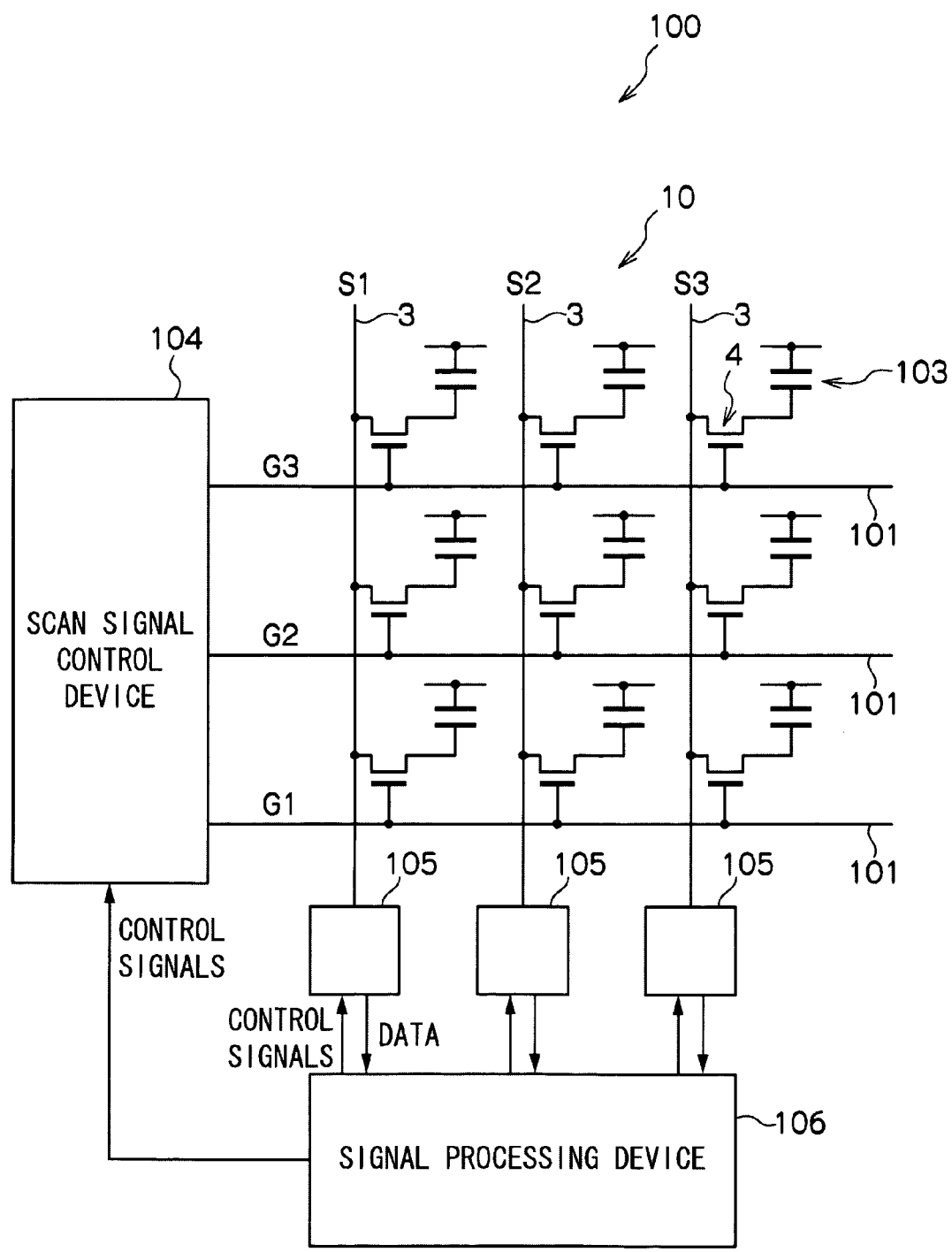
FIG. 1 is a structural drawing showing the overall structure of a radiation image detection device relating to first and second exemplary embodiments.

The overall structure of the radiation image detection device 100 relating to a first exemplary embodiment is illustrated in FIG. 1. However, a scintillator that converts radiation into light is not illustrated.

As shown in FIG. 1, the radiation image detection device 100 relating to the present exemplary embodiment has an electromagnetic wave detecting element 10.

The electromagnetic wave detecting element 10 has upper electrode, semiconductor layer, and lower electrode that will be described later. A large number of pixels that are structured to include sensor portions 103 and TFT switches 4 are provided in a two-dimensional form at the electromagnetic wave detecting element 10. The sensor portion 103 receives light, that is obtained by irradiated radiation being converted at a scintillator, and accumulates charges. The TFT switch 4 reads-out the charges accumulated in the sensor portion 103.

Plural scan lines 101 for turning the TFT switches 4 on and off, and plural signal lines 3 for reading-out the charges accumulated in the sensor portions 103, are provided at the electromagnetic wave detecting element 10 so as to intersect one another.

Due to any of the TFT switches 4 that are connected to the signal line 3 being turned on, an electric signal corresponding to the charge amount accumulated in the sensor portion 103 flows to the signal line 3. Signal detecting circuits 105, that detect the electric signals that flow-out to the signal lines 3, are connected to the respective signal lines 3. Further, a scan signal controlling device 104, that outputs control signals for turning the TFT switches 4 on and off to the scan lines 101, is connected to the respective scan lines 101.

The signal detecting circuits 105 incorporate therein, for each of the signal lines 3, an amplifying circuit that amplifies the inputted electric signal. At the signal detecting circuits 105, the electric signals that are inputted from the respective signal lines 3 are amplified by the amplifying circuits and detected. The signal detecting circuits 105 thereby detect the charge amounts accumulated in the respective sensor portions 103 as information of the respective pixels structuring the image.

The signal detecting circuits 105 and the scan signal controlling device 104 carry out predetermined processings on the electric signals detected at the signal detecting circuits 105. Further, a signal processing device 106 is connected to the signal detecting circuits 105 and the scan signal controlling device 104. The signal processing device 106 outputs control signals expressing signal detecting timings to the signal detecting circuits 105, and outputs control signals expressing scan signal outputting timings to the scan signal controlling device 104.

Figure 2:
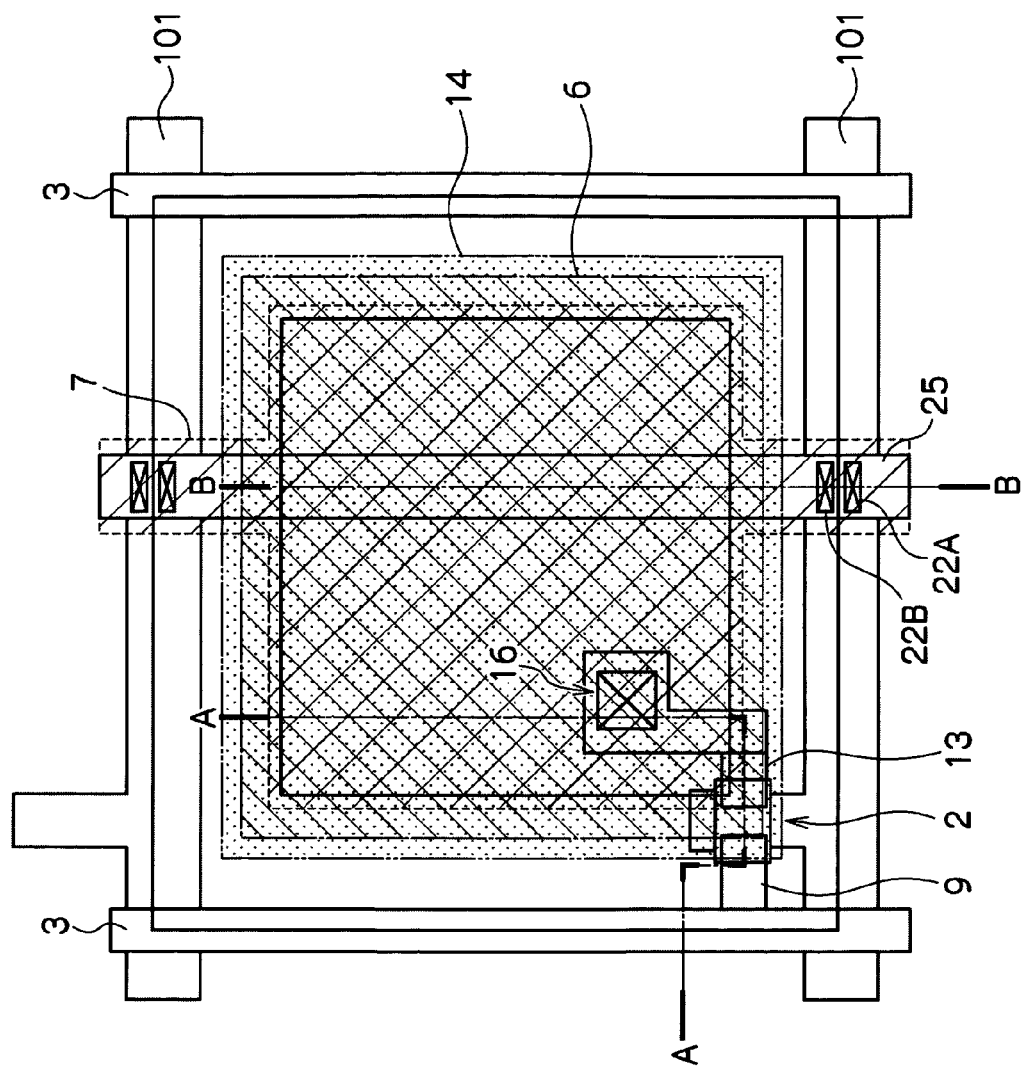
FIG. 2 is a plan view showing the structure of one pixel unit of an electromagnetic wave detecting element relating to the first exemplary embodiment.

Next, the electromagnetic wave detecting element 10 relating to the present exemplary embodiment will be described in further detail with reference to FIG. 2 and FIG. 3. Note that a plan view showing the structure of one pixel unit of the electromagnetic wave detecting element 10 relating to the present exemplary embodiment is shown in FIG. 2. Further, a cross-sectional view along line A-A of FIG. 2 is shown in FIG. 3A, and a cross-sectional view along line B-B of FIG. 2 is shown in FIG. 3B.

Figure 3A:
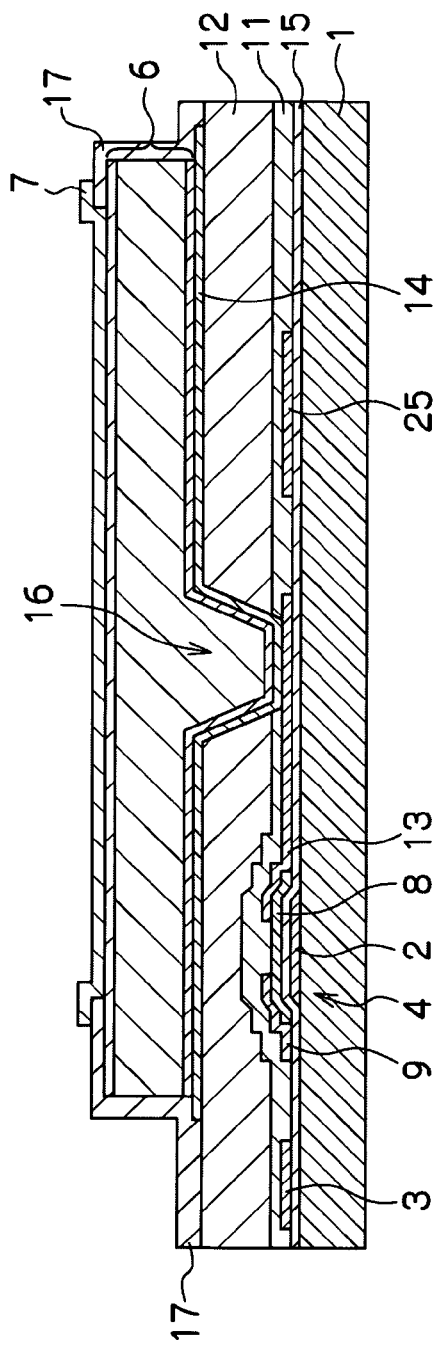
FIG. 3A and FIG. 3B are line cross-sectional views of the electromagnetic wave detecting element relating to the first exemplary embodiment.
Figure 3B:
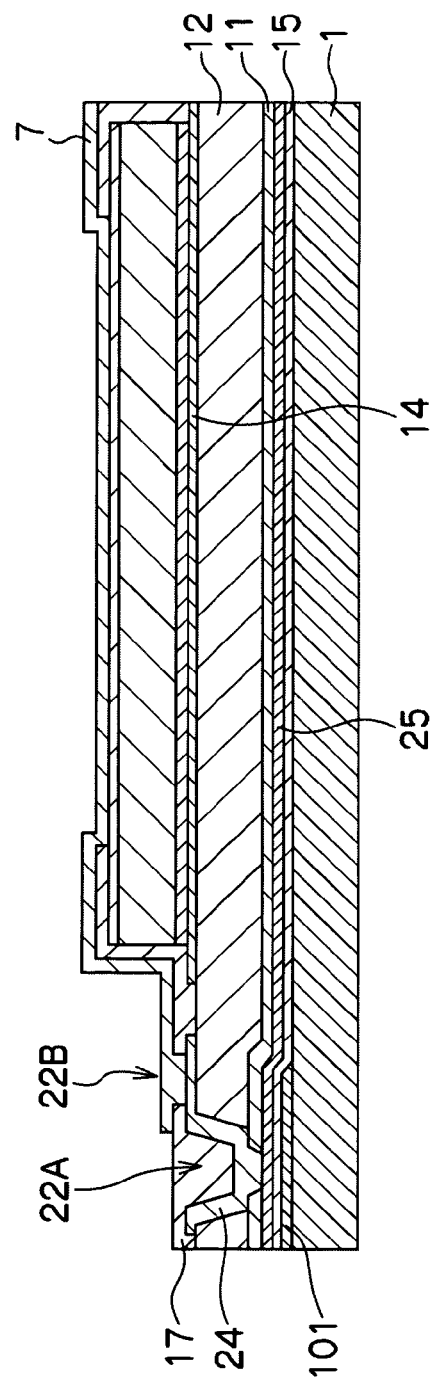

As shown in FIG. 3A and FIG. 3B, at the electromagnetic wave detecting element 10, the scan line 101 and gate electrode 2 are formed on an insulative substrate 1 that is formed from alkaline-free glass or the like, and the scan line 101 and the gate electrode 2 are connected (see FIG. 2). The wiring layer at which the scan lines 101 and the gate electrodes 2 are formed (hereinafter, this wiring layer is also called a "first signal wiring layer") is formed by using Al or Cu, or a layered film formed mainly of Al or Cu. However, the formation of the wiring layer is not limited to these.

An insulating film 15 is formed on the entire surface on the scan line 101 and the gate electrode 2, so as to cover the scan line 101 and the gate electrode 2. The region of the insulating film 15 that is positioned above the gate electrode 2 works as a gate insulating film at the TFT switch 4. The insulating film 15 is formed of, for example, SiNx or the like. The insulating film 15 is formed by, for example, CVD (Chemical Vapor Deposition).

Semiconductor active layer 8 is formed as islands on the gate electrode 2 on the insulating film 15. The semiconductor active layer 8 is the channel portion of the TFT switch 4. The semiconductor active layer 8 is formed from, for example, an amorphous silicon film.

A source electrode 9 and a drain electrode 13 are formed at the upper layer thereof. Together with the source electrodes 9 and the drain electrode 13, the signal line 3, and common electrode line 25 that are parallel to the signal line 3, are formed at the wiring layer at which the source electrode 9 and the drain electrode 13 are formed. The source electrode 9 is connected to the signal line 3. The wiring layer in which the signal lines 3, the source electrodes 9 and the common electrode lines 25 are formed (hereinafter, this wiring layer is also called a "second signal wiring layer") is formed by using Al or Cu, or a layered film formed mainly of Al or Cu. However, the formation of the wiring layer is not limited to these.

A contact layer (not shown) is formed between, on the one hand, the source electrode 9 and the drain electrode 13, and, on the other hand, the semiconductor active layer 8. This contact layer is formed from an impurity-added semiconductor such as an impurity-added amorphous silicon or the like. The TFT switch 4 for switching is structured as described above.

A TFT protecting film layer 11 is formed on substantially the entire surface of the region on the substrate 1 where the pixels are provided (substantially the entire region), so as to cover the semiconductor active layer 8, the source electrodes 9, the drain electrodes 13, the signal lines 3 and the common electrode lines 25. The TFT protecting film layer 11 is formed of, for example, $SiN_X$ or the like. The TFT protecting film layer 11 is formed by, for example, CVD.

A coating-type interlayer insulating film 12 is formed on the TFT protecting film layer 11. The interlayer insulating film 12 is formed to a film thickness of 1 to 4 μm from a photosensitive organic material (e.g., a positive photosensitive acrylic resin: a material in which a naphthoquinonediazide positive photosensitive agent is mixed together with a base polymer formed from a copolymer of methacrylic acid and glycidyl methacrylate, or the like) having a low permittivity (dielectric constant $\Sigma_r = 2$ to 4). In the electromagnetic wave detecting element 10 relating to present exemplary embodiment, the capacity between the metals that are disposed at the upper layer and the lower layer of the interlayer insulating film 12 is kept low by the interlayer insulating film 12. Further, generally, such a material also functions as a flattening film, and also has the effect of flattening the steps of the lower layer. Because the shapes of semiconductor layer 6 that are disposed at the upper layer are flattened thereby, a decrease in the absorption efficiency due to unevenness of the semiconductor layer 6, and an increase in leak current can be suppressed. Contact holes 16 and contact holes 22A are formed respectively in the interlayer insulating film 12 and the TFT protecting film layer 11 at positions opposing the drain electrodes 13 and at positions that are at the irradiation surface sides of the regions where the scan lines 101 are formed.

A lower electrode 14 of the sensor portion 103 is formed on the interlayer insulating film 12, so as to cover the pixel region while filling-in the contact hole 16. The drain electrode 13 of the TFT switch 4 is connected to the lower electrode 14. If the semiconductor layer 6 that will be described later is formed to be thick and around 1 μm, the material of the lower electrode 14 is not limited provided that it is electrically-conductive. Therefore, the lower electrode 14 can be formed by using an electrically-conductive metal such as an Al-type material, ITO (indium tin oxide), or the like.

On the other hand, if the film thickness of the semiconductor layer 6 is thin (around 0.2 to 0.5 μm), the absorption of light at the semiconductor layer 6 is insufficient. Therefore, in order to prevent an increase in leak current due to the illumination of light onto the TFT switch 4, it is preferable to make the semiconductor layer 6 be an alloy or a layered film that is formed mainly of a light-shielding metal.

The semiconductor layer 6 that functions as a photodiode is formed on the lower electrode 14. In the present exemplary embodiment, a PIN structure photodiode is employed as the semiconductor layer 6. The photodiode is formed by layering an $n^+$ layer, an i layer, and a $p^+$ layer in that order from the lower layer. Note that, in the present exemplary embodiment, the lower electrode 14 is made to be larger than the semiconductor layer 6. Further, if the film thickness of the semiconductor layer 6 is thin (e.g., less than or equal to 0.5 μm), in order to prevent incidence of light onto the TFT switch 4, it is preferable to place a light-shielding metal to cover the TFT switch 4.

Further, in order to suppress the advancing of light into the TFT switch 4 due to irregular reflection of light at the device interior, the interval from the channel portion of the TFT switch 4 to the end portion of the lower electrode 14 that is formed from a light-shielding metal is ensured to be greater than or equal to 5 μm.

A protective insulating film 17 is formed on the interlayer insulating film 12 and the semiconductor layer 6, so as to have openings at the respective semiconductor layer 6 portions. An upper electrode 7 is formed on the semiconductor layer 6 and the protective insulating film 17, at least so as to cover the opening portion of the protective insulating film 17. A material having high light transmittance, such as, for example, ITO or IZO (indium zinc oxide) or the like, is used as the upper electrodes 7. The upper electrodes 7 is also used as an electrically-conductive member that is connected to the common electrode lines 25 disposed at the lower layer for supplying bias voltage to the upper electrodes 7. As shown in FIG. 3B, the common electrode line 25 are connected to a contact pad 24 that is formed in the layer of the lower electrode 14 via the contact hole 22A provided in the first interlayer insulating film 12. Further, the upper electrode 7 and the common electrode line 25 are electrically connected by a contact hole 22B, that is provided in the protective insulating film 17, being covered by the upper electrode 7.

Figure 16A:
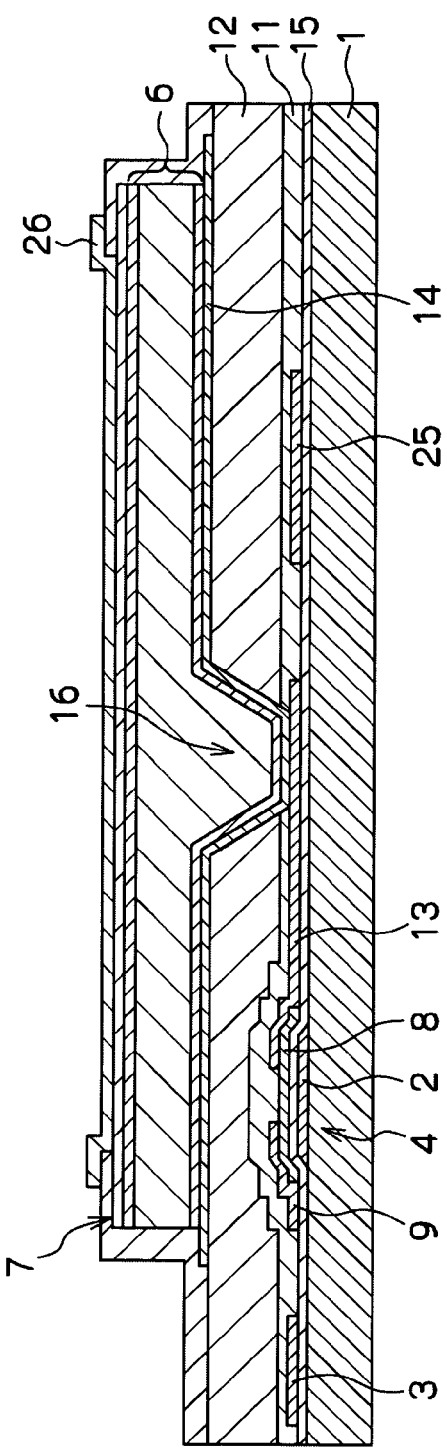
FIG. 16A and FIG. 16B are line cross-sectional views of the electromagnetic wave detecting element of the other structure.
Figure 16B:
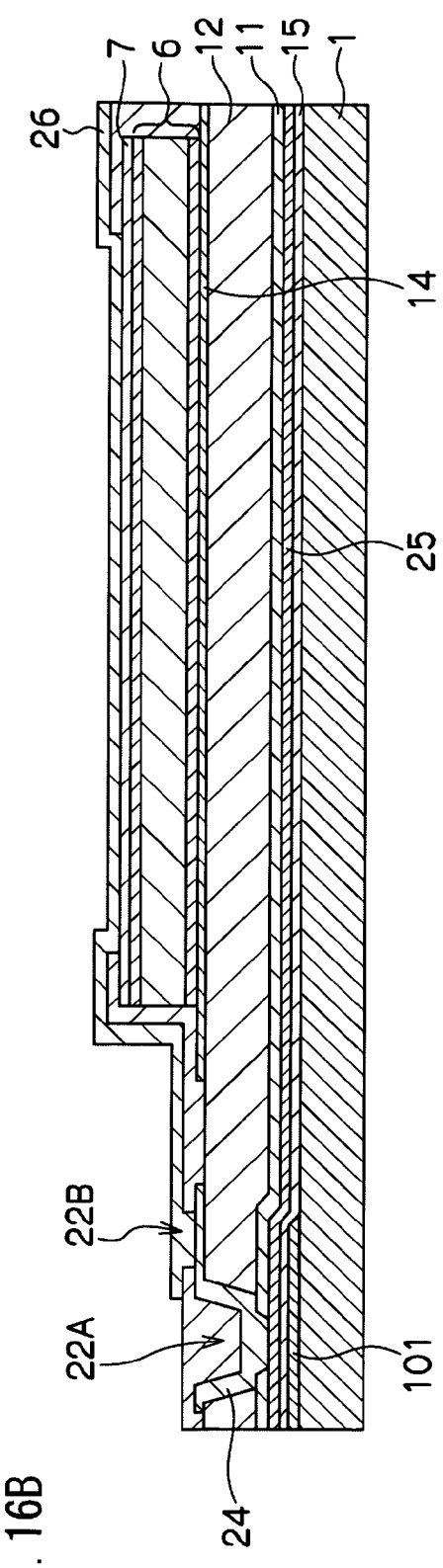

Here, the electrically-conductive member that connects the upper electrodes 7 and the common electrode lines 25 may be formed by a metal of another layer. For example, in another structural example of the electromagnetic wave detecting element 10 that is shown in FIG. 15 and FIG. 16, the upper electrode 7 and the semiconductor layer 6 are formed integrally in order to decrease the contact resistance between the semiconductor layer 6 and the upper electrode 7. Therefore, as shown in FIG. 16A and FIG. 16B, the upper electrode 7 and the semiconductor layer 6 are the same shape. Further, an electrically-conductive member 26, that is connected to the common electrode line 25, is disposed on the opening portion of the protective insulating film 17 at a layer that is separate from the upper electrode 7. In the same way as the upper electrodes 7, a material having high light transmittance, such as, for example, ITO or IZO (indium zinc oxide) or the like, is used as this electrically-conductive member 26.

Figure 4:
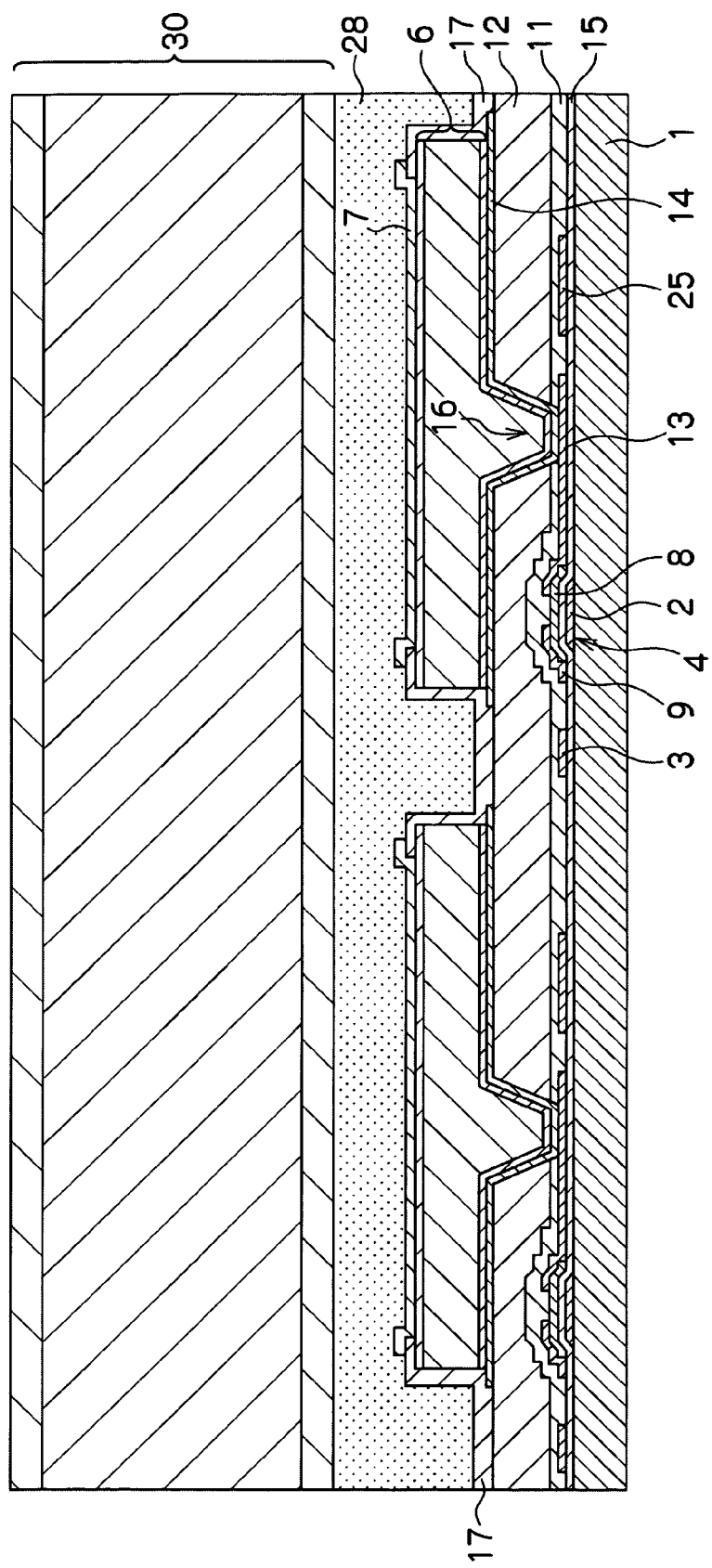
FIG. 4 is a line cross-sectional view of the electromagnetic wave detecting element to which a scintillator is affixed, relating to the first exemplary embodiment.

As shown in FIG. 4, a scintillator 30 formed of GOS or the like is affixed to the electromagnetic wave detecting element 10 that is formed in this way, by using an adhesive resin 28 having low light absorbance, or the like.

Next, an example of the processes of fabricating the electromagnetic wave detecting element 10 relating to the first exemplary embodiment will be described with reference to FIG. 5A through FIG. 5I.

Figure 5A:
FIG. 5A through FIG. 5I are drawings for explaining processes of fabricating the electromagnetic wave detecting element relating to the first exemplary embodiment.

First, the gate electrodes 2 and the scan lines 101 are formed on the substrate 1 as the first signal wiring layer (FIG. 5A). This first signal wiring layer is formed from a low-resistance metal such as Al, an Al alloy or the like, or from a layered film that is layered with a barrier metal layer formed from a high melting point metal. The first signal wiring layer is deposited on the substrate 1 by sputtering to a film thickness of around 100 to 300 nm. Thereafter, patterning of a resist film is carried out by a photolithographic technique. Thereafter, the metal film is patterned by wet etching using an etchant for Al or by dry etching. By removing the resist thereafter, the first signal wiring layer is completed.

Figure 5B:

Next, the insulating film 15, the semiconductor active layer 8, and the contact layer (not shown) are successively deposited on the first signal wiring layer (FIG. 5B). The insulating film 15 is formed from SiNx, and the film thickness thereof is 200 to 600 nm. The semiconductor active layer 8 is formed from amorphous silicon, and the film thickness thereof is around 20 to 200 nm. Further, the contact layers are formed from an impurity-added amorphous silicon, and the film thickness thereof is around 10 to 100 nm. These layers are deposited by P-CVD (Plasma-Chemical Vapor Deposition). Thereafter, in the same way as the first signal wiring layer, patterning of the resist is carried out by a photolithographic technique. Thereafter, the semiconductor active regions are formed by selectively dry etching, with respect to the insulating film 15, the semiconductor active layer 8 and the contact layer that are formed by an impurity-added semiconductor.

Figure 5C:
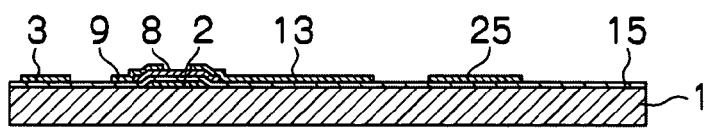
Figure 5D:
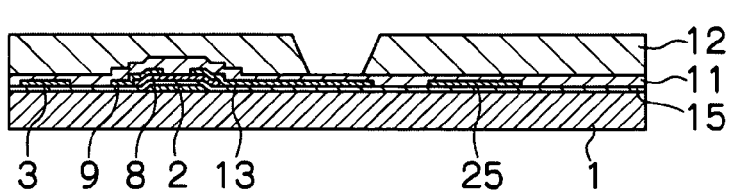

Next, the signal lines 3, the source electrodes 9, the drain electrodes 13, and the common electrode lines 25 are formed as the second signal wiring layer at the top layer of the insulating film 15 and the semiconductor active layer 8 (FIG. 5C). In the same way as the first signal wiring layer, the second signal wiring layer is formed from a low-resistance metal such as Al, an Al alloy or the like, or from a layered film that is layered with a barrier metal layer formed from a high melting point metal, or from a single layer of a high melting point metal film such as Mo or the like, and the film thickness thereof is around 100 to 300 nm. In the same way as the first signal wiring layer, patterning is carried out by a photolithographic technique, and the metal film is patterned by wet etching using an etchant for Al or by dry etching. By selectively employing the etching method at this time, the insulating film 15 is not removed. In dry etching, portions of the contact layers and the semiconductor active layer 8 are removed and channel regions are formed.

Next, the TFT protecting film layer 11 and the interlayer insulating film 12 are successively formed at the upper layer of the layers that were formed as described above (FIG. 5D). There are cases in which the TFT protecting film layer 11 and the interlayer insulating film 12 are a single body of an inorganic material, and cases in which they are formed by layering a protective insulating film formed of an inorganic material and an interlayer insulating film formed of an organic material, and cases in which they are formed by a single layer of an interlayer insulating film that is organic. In the present exemplary embodiment, there is a layered structure of the interlayer insulating film 12 that is photosensitive and the TFT protecting film layer 11 that is formed of an inorganic material, in order to stabilize the characteristics of the TFT switches 4 and suppress the electrostatic capacity between the lower electrodes 14 and the common electrode lines 25 at the lower layer. Accordingly, for example, the TFT protecting film layer 11 is formed by CVD, the interlayer insulating film 12 material that is photosensitive and is a coating material is coated, and after pre-baking, the steps of exposure and developing are carried out, and thereafter, baking is carried out such that the respective layers are formed.

Figure 5E:
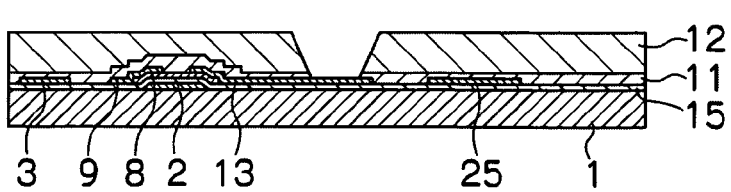

Next, the TFT protecting film layer 11 is patterned by a photolithographic technique (FIG. 5E). Note that this step is not necessary in cases in which the TFT protecting film layer 11 is not provided.

Figure 5F:
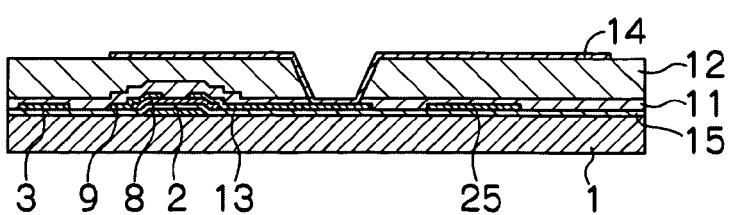

Next, an Al-type material or a metal material such as ITO or the like is deposited by sputtering to a film thickness of around 20 to 200 nm on the top layer of the above-described layers. Then, patterning is carried out by a photolithographic technique, and patterning is carried out by wet etching using an etchant for metal or the like or by dry etching, so as to form the lower electrodes 14 (FIG. 5F).

Figure 5G:
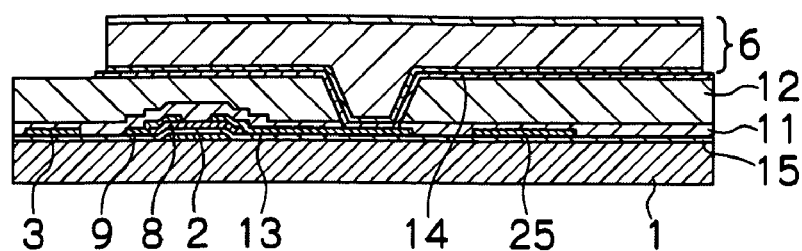

Next, by using CVD, respective layers of n+, i, p+ are deposited in order from the lower layer, so as to form the semiconductor layer 6 (see FIG. 5G). The film thickness of the n+ layer is 50 to 500 nm, the film thickness of the i layer is 0.2 to 2 μm, and the film thickness of the p+ layer is 50 to 500 nm. The respective layers are layered in order and the semiconductor layer 6 are patterned by a photolithographic technique, and by selectively etching the interlayer insulating film 12 at the lower layer by dry etching or by wet etching, the semiconductor layer 6 are completed.

Here, the semiconductor layer 6 is formed by layering n+, i, p+ in order. However, the semiconductor layer 6 may be a PIN diode by layering p+, i, n+ in order.

Figure 5H:
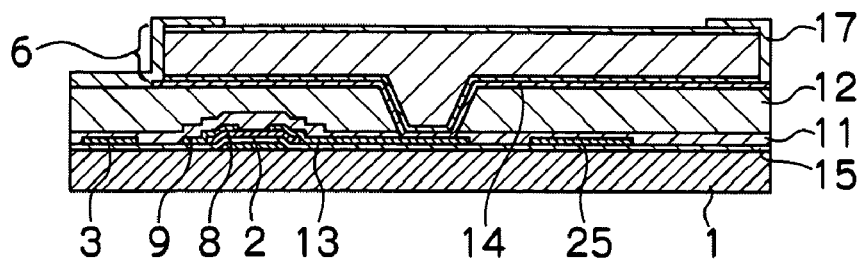

Next, the protective insulating film 17 that is formed from an SiNx film is deposited by CVD or the like so as to cover the semiconductor layer 6. The film thickness of the protective insulating film 17 is around 100 to 300 nm. Patterning is carried out by a photolithographic technique, and patterning is carried out by dry etching, and opening portions are formed (FIG. 5H). Here, SiNx is used as an example of the CVD film. However, the protective insulating film 17 is not limited to SiNx, and another material may be applied provided that it is an insulating material.

Figure 5I:
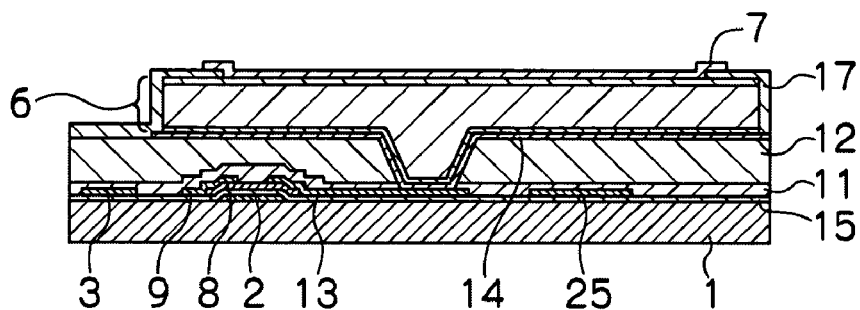

Next, the connection regions of the upper electrodes 7 and the common electrode lines 25 are formed (FIG. 5I). The connection regions of the upper electrodes 7 and the common electrode lines 25 are formed by depositing, by sputtering, a transparent electrode material such as ITO or the like on the top layer of the layers that were formed as described above. The film thickness of the connection regions is around 20 to 200 nm. The connection regions are formed by carrying out patterning by a photolithographic technique, and by patterning the upper electrodes 7 by wet etching using an etchant for ITO or the like or by dry etching. By employing etching selectively at this time, the protective insulating film 17 at the lower layer is not damaged.

Finally, by affixing the scintillator 30 formed of GOS by using the adhesive resin 28 or the like, the electromagnetic wave detecting element 10 is formed as shown in FIG. 4.

Principles of the operation of the radiation image detection device 100 of the above-described structure will be described next.

When X-rays are irradiated from above in FIG. 4, the irradiated X-rays are absorbed by the scintillator 30 and are converted into visible light. The X-rays may be irradiated from below in FIG. 4. In this case as well, the X-rays are absorbed by the scintillator 30 and are converted into visible light. The light amount generated from the scintillator 30 is 0.5 to 2 μW/cm² in conventional X-ray photography for medical diagnosis. This generated light passes through the layer of the adhesive resin 28, and is illuminated onto the semiconductor layer 6 of the sensor portions 103 that are arranged in the form of an array on the TFT array substrate.

At the electromagnetic wave detecting element 10, the semiconductor layer 6 is provided so as to be separated into the respective pixel units. A predetermined bias voltage is applied to the semiconductor layer 6 from the upper electrode 7 via the common electrode line 25, and when light is illuminated, charges are generated at the interior of the semiconductor layer 6. For example, in the case of the semiconductor layer 6 having a PIN structure that is layered in the order of n⁺-i-p⁺ (n⁺ amorphous silicon, amorphous silicon, p⁺ amorphous silicon), negative bias voltage is applied to the upper electrode 7. If the film thickness of the i layer is around 1 μm, the bias voltage that is applied is around −5 to −10 V When light is not illuminated, only current that is less than or equal to several to several tens of pA/mm² flows at the semiconductor layer 6. On the other hand, when light is illuminated (100 μW/cm²), the semiconductor layer 6 generates light current of around 0.3 μA/mm². The generated charges are collected by the lower electrode 14. The lower electrode 14 is connected to the drain electrode 13 of the TFT switch 4. Further, the source electrode 9 of the TFT switch 4 is connected to the signal line 3. At the time of image detection, negative bias is applied to the gate electrode 2 of the TFT switch 4 and the TFT switch 4 is maintained in an off state, and the charges collected by the lower electrode 14 are accumulated.

At the time of reading-out the image, on signals (+10 to 20 V) are successively applied to the gate electrodes 2 of the TFT switches 4 via the scan lines 101. Due to the TFT switches 4 being successively turned on thereby, electric signals corresponding to the charge amounts accumulated in the lower electrodes 14 flow-out to the signal lines 3. On the basis of the electric signals that flow-out to the signal lines 3, the signal detecting circuits 105 detect the charge amounts accumulated in the respective sensor portions 103 as information of the respective pixels forming the image. The image information expressed by the X-rays that are irradiated onto the electromagnetic wave detecting element 10 can thereby be obtained.

At the electromagnetic wave detecting element 10 relating to the present exemplary embodiment, the common electrode lines 25 are formed, with respect to the sensor portions 103, at the non-illumination surface side of the visible light from the scintillator 30 (the downstream side of the visible light). Further, at the electromagnetic wave detecting element 10 relating to the present exemplary embodiment, bias voltage is supplied to the upper electrode 7 via the contact holes 22A, 22B.

Due thereto, shielding, by the common electrode lines 25, of the light that is converted into visible light by the scintillator 30 and is illuminated onto the semiconductor layer 6, is eliminated. Therefore, a decrease in light utilization efficiency at the sensor portions 103 can be prevented.

Second Exemplary Embodiment

In a case in which different types of lines are formed at the same wiring layer in the electromagnetic wave detecting element 10, it is easy for leaks to arise between the lines due to poor patterning.

Thus, a second exemplary embodiment describes a case in which the scan lines 101, the signal lines 3, and the common electrode lines 25 are formed by different wiring layers.

Figure 6:
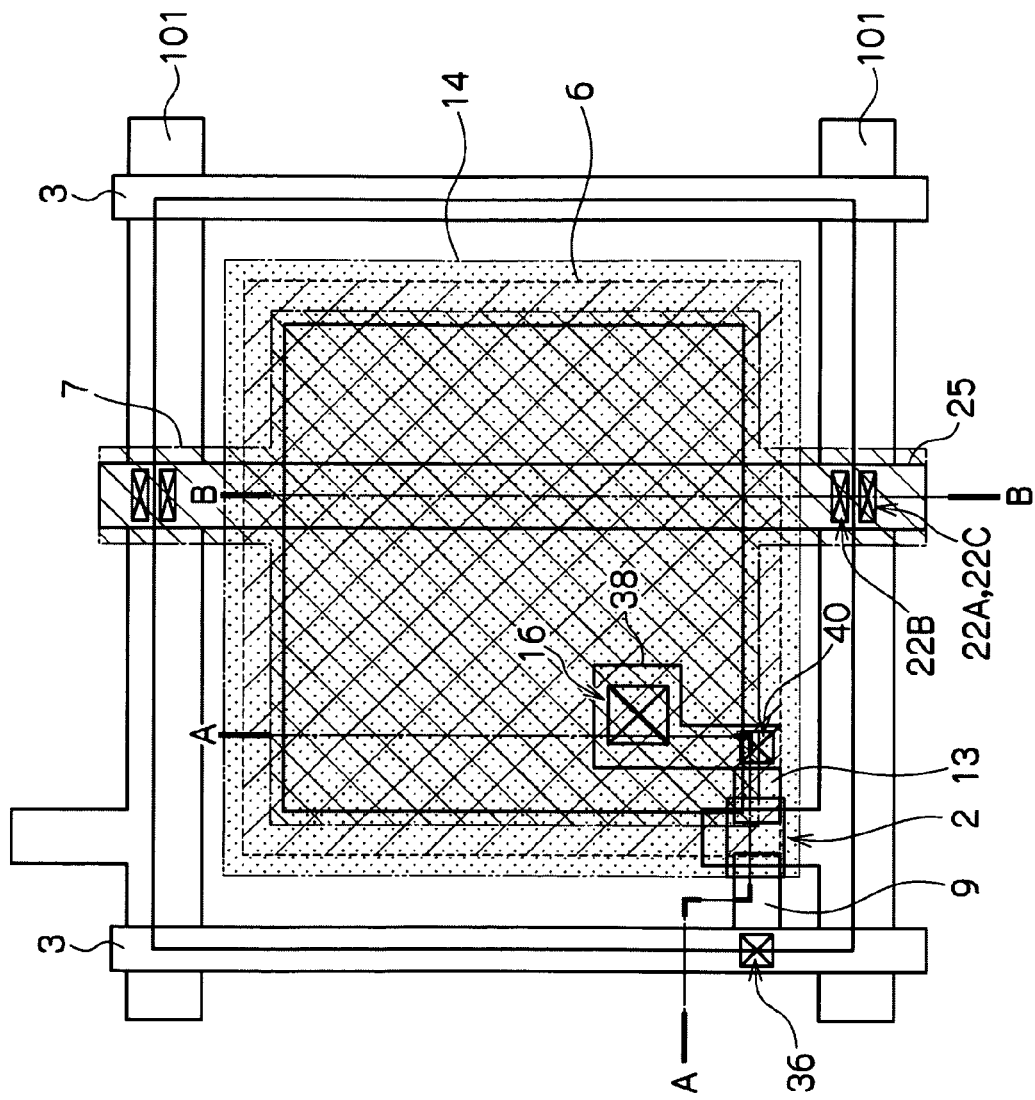
FIG. 6 is a plan view showing the structure of one pixel unit of an electromagnetic wave detecting element relating to the second exemplary embodiment.
Figure 7A:
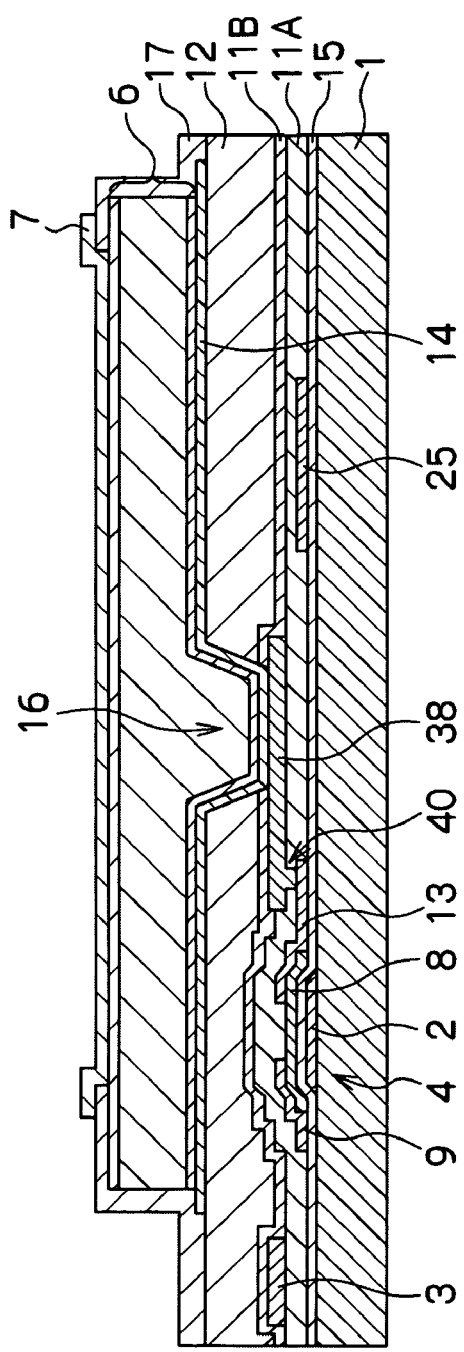
FIG. 7A and FIG. 7B are line cross-sectional views of the electromagnetic wave detecting element relating to the second exemplary embodiment.
Figure 7B:
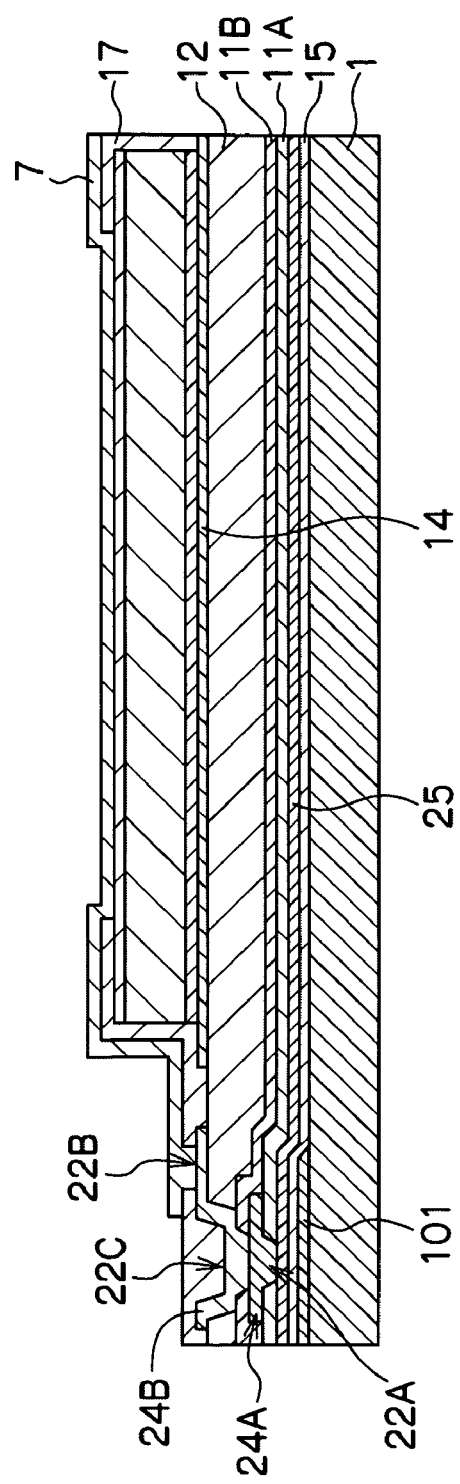

A plan view showing the structure of one pixel unit of the electromagnetic wave detecting element 10 relating to the second exemplary embodiment is shown in FIG. 6. Further, a cross-sectional view along line A-A of FIG. 6 is shown in FIG. 7A, and a cross-sectional view along line B-B of FIG. 6 is shown in FIG. 7B. Description of portions in FIG. 6 and FIG. 7, that are the same as in FIG. 2 and FIG. 3, is omitted.

As shown in FIG. 7A and FIG. 7B, at the electromagnetic wave detecting element 10, the scan line 101 and the gate electrode 2 are formed on the substrate 1, and the scan line 101 and the gate electrode 2 are connected (see FIG. 6).

The insulating film 15 is formed on the entire surface on the scan line 101 and the gate electrode 2, so as to cover the scan line 101 and the gate electrode 2. The region of the insulating film 15 that is positioned above the gate electrode 2 works as a gate insulating film at the TFT switch 4.

The semiconductor active layer 8 is formed as islands on the gate electrode 2 on the insulating film 15.

The common electrode line 25 are formed, parallel to the signal line 3, at the upper layer of the insulating film 15 at which the source electrode 9 and the drain electrode 13 are formed at the upper layer of the semiconductor active layer 8.

A first TFT protecting film layer 11A is formed on the source electrode 9, the drain electrode 13 and the common electrode line 25 on substantially the entire surface of the region on the substrate 1 where the pixels are provided, so as to cover the source electrode 9, the drain electrode 13 and the common electrode line 25.

The signal line 3, contact pad 24A and contact pad 38 are formed on the first TFT protecting film layer 11A. The signal line 3 is connected to the source electrode 9 via a contact hole 36 (see FIG. 6). The signal line 3 is connected to the common electrode lines 25 via the contact pad 24A and the contact hole 22A. Further, the contact pad 38 is connected to the drain electrode 13 via a contact hole 40.

A second TFT protecting film layer 11B is formed on the signal lines 3, the contact pads 24A and the contact pads 38 on substantially the entire surface of the region on the substrate 1 where the pixels are provided, so as to cover the signal lines 3, the contact pads 24A and the contact pads 38. Further, the coating-type interlayer insulating film 12 is formed on the second TFT protecting film layer 11B.

Contact hole 22C and the contact hole 16 are formed respectively in the second TFT protecting film layer 11B and the interlayer insulating film 12 at positions opposing the contact pads 24A and at positions where the contact pad 38 of the illumination surface sides of the regions where the scan line 101 are formed are provided.

In the same way as in the first exemplary embodiment, the lower electrode 14, the semiconductor layer 6 and the upper electrode 7 of the sensor portion 103, and the protective insulating film 17 are formed on the interlayer insulating film 12. The contact pad 24A is connected to the contact pad 24B, that is formed in the layer of the lower electrode 14, via the contact hole 22C provided in the first interlayer insulating film 12. Further, by covering the top of the contact hole 22B provided in the protective insulating film 17 with the upper electrode 7, the upper electrode 7 and the common electrode line 25 are electrically connected.

Figure 8:
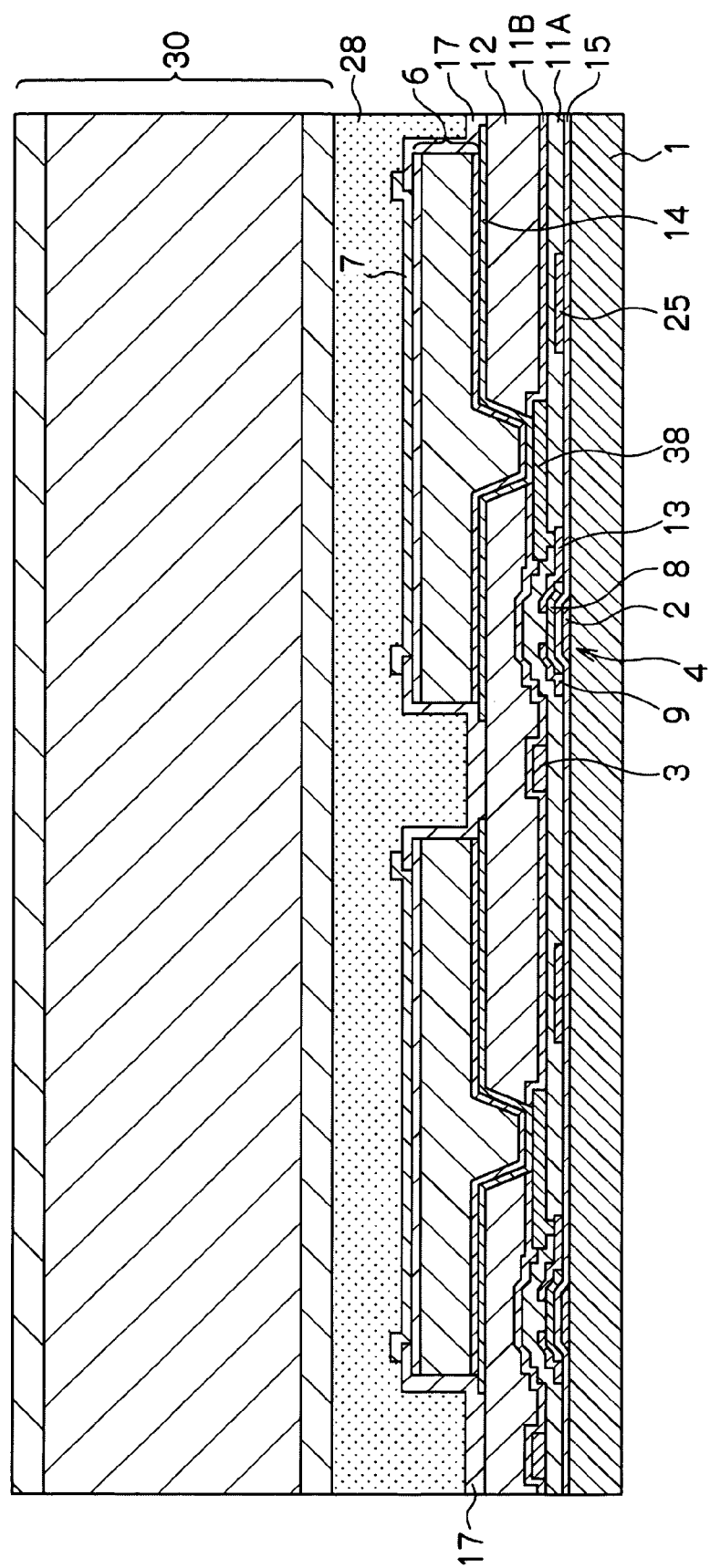
FIG. 8 is a line cross-sectional view of the electromagnetic wave detecting element to which a scintillator is affixed, relating to the second exemplary embodiment.

Then, as shown in FIG. 8, the scintillator 30 formed of GOS or the like is affixed to the electromagnetic wave detecting element 10 that is formed in this way, by using the adhesive resin 28 having low light absorbance, or the like.

Next, an example of the processes of fabricating the electromagnetic wave detecting element 10 relating to the second exemplary embodiment will be described with reference to FIG. 9A through FIG. 9J. Note that description of portions in FIG. 9 that are the same as in FIG. 5 is omitted. Further, with regard to the materials, the film thicknesses and the methods of forming the respective layers, description of portions that are the same as in the first exemplary embodiment is omitted.

Figure 9A:
FIG. 9A through FIG. 9J are drawings for explaining processes of fabricating the electromagnetic wave detecting element relating to the second exemplary embodiment.

First, the gate electrodes 2 and the scan lines 101 are formed on the substrate 1. Next, the insulating film 15 is formed on the entire surface so as to cover the gate electrodes 2 and the scan lines 101. Then, the semiconductor active layer 8 and the contact layers (not shown) are formed on the insulating film 15 (FIG. 9A).

Figure 9B:
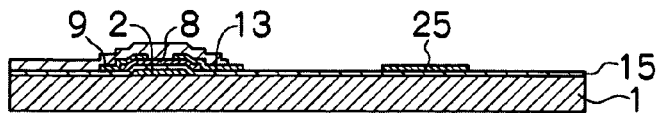

Next, the source electrodes 9 and the drain electrodes 13 are formed at the top layer of the semiconductor active layer 8. Then, the common electrode lines 25 are formed on the insulating film 15 (FIG. 9B).

Figure 9C:
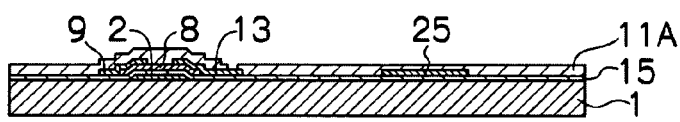

Next, the first TFT protecting film layer 11A is formed on substantially the entire surface, so as to cover the source electrodes 9, the drain electrodes 13, and the common electrode lines 25. Subsequently, the first TFT protecting film layer 11A is patterned by a photolithographic technique (FIG. 9C).

Figure 9D:
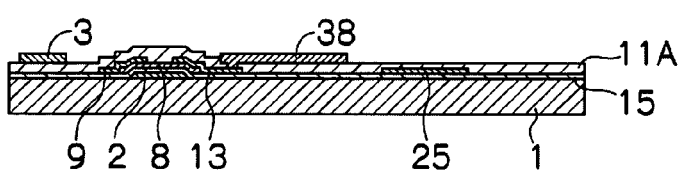
Figure 9E:
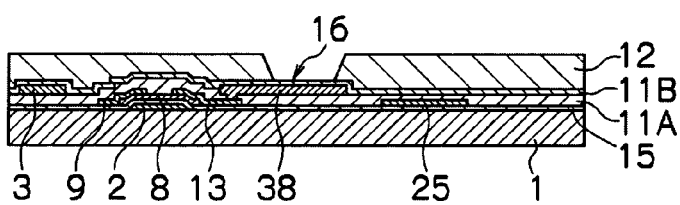

Next, the signal lines 3, the contact pads 24A and the contact pads 38 are formed on the first TFT protecting film layer 11A (FIG. 9D).

Then, the second TFT protecting film layer 11B and the interlayer insulating film 12 are successively formed on the top surface of the layers that are formed as described above (FIG. 9E).

Figure 9F:
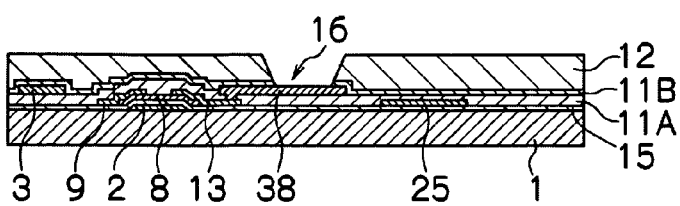

Next, the second TFT protecting film layer 11B is patterned by a photolithographic technique (FIG. 9F).

Figure 9G:
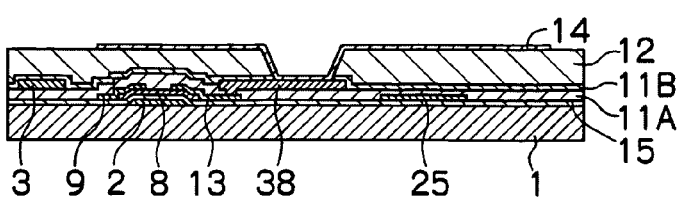

Next, an Al-type material or a metal material such as ITO or the like is deposited by sputtering on the top layer of the aforementioned layer, and the lower electrodes 14 are formed by patterning (FIG. 9G).

Figure 9H:
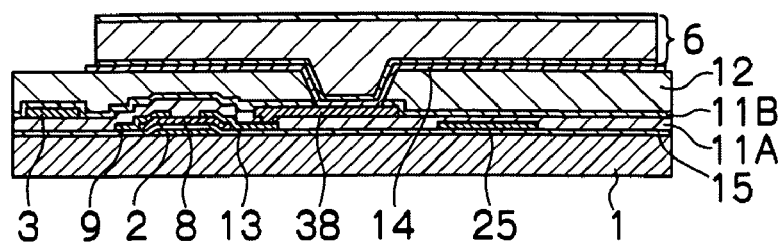
Figure 9I:
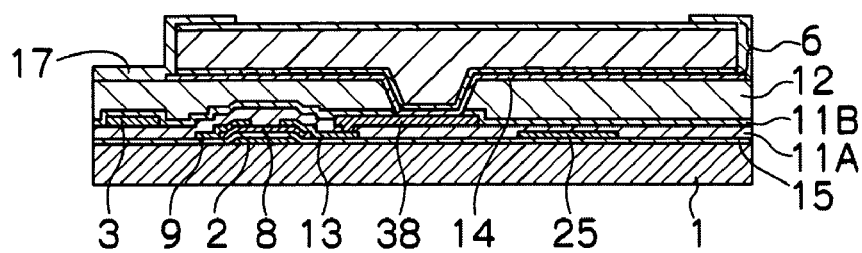
Figure 9J:
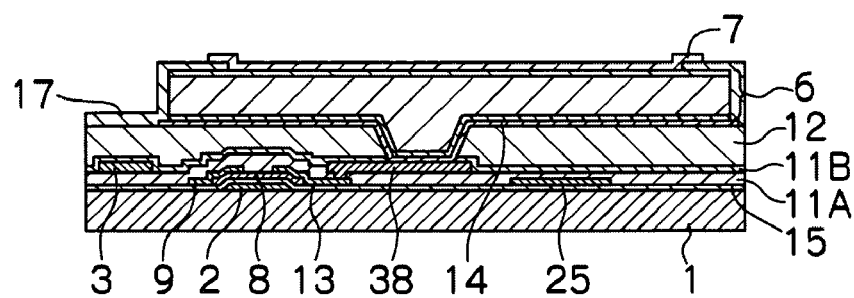

Then, in a structure similar to that of first exemplary embodiment, the semiconductor layer 6 is formed on the interlayer insulating film 12 (FIG. 9H). Moreover, the protective insulating film 17 is formed (FIG. 9I). Then, the connection regions of the upper electrodes 7 and the common electrode lines 25 are formed (FIG. 9J).

In this way, at the electromagnetic wave detecting element 10 relating to the present exemplary embodiment, the scan lines 101, the signal lines 3, and the common electrode lines 25 are formed at different wiring layers.

Due thereto, even if poor pattering arises at the time of forming the common electrode lines 25 and the film of the electrically-conductive material remains, leak defects of the scan lines 101 and the signal lines 3 do not arise.

Third Exemplary Embodiment

In the first and second exemplary embodiments, the connection regions of the upper electrodes 7 and the common electrode lines 25 are formed on the protective insulating film 17. However, there are cases in which disconnection or the like of the connection regions arises due to changes in the steep angle of the protective insulating film 17 at the lower layer, or cracking, or the like.

Thus, the third exemplary embodiment describes a case in which an interlayer insulating film 18 is further formed at the peripheries of the respective semiconductor layer 6.

Figure 17:
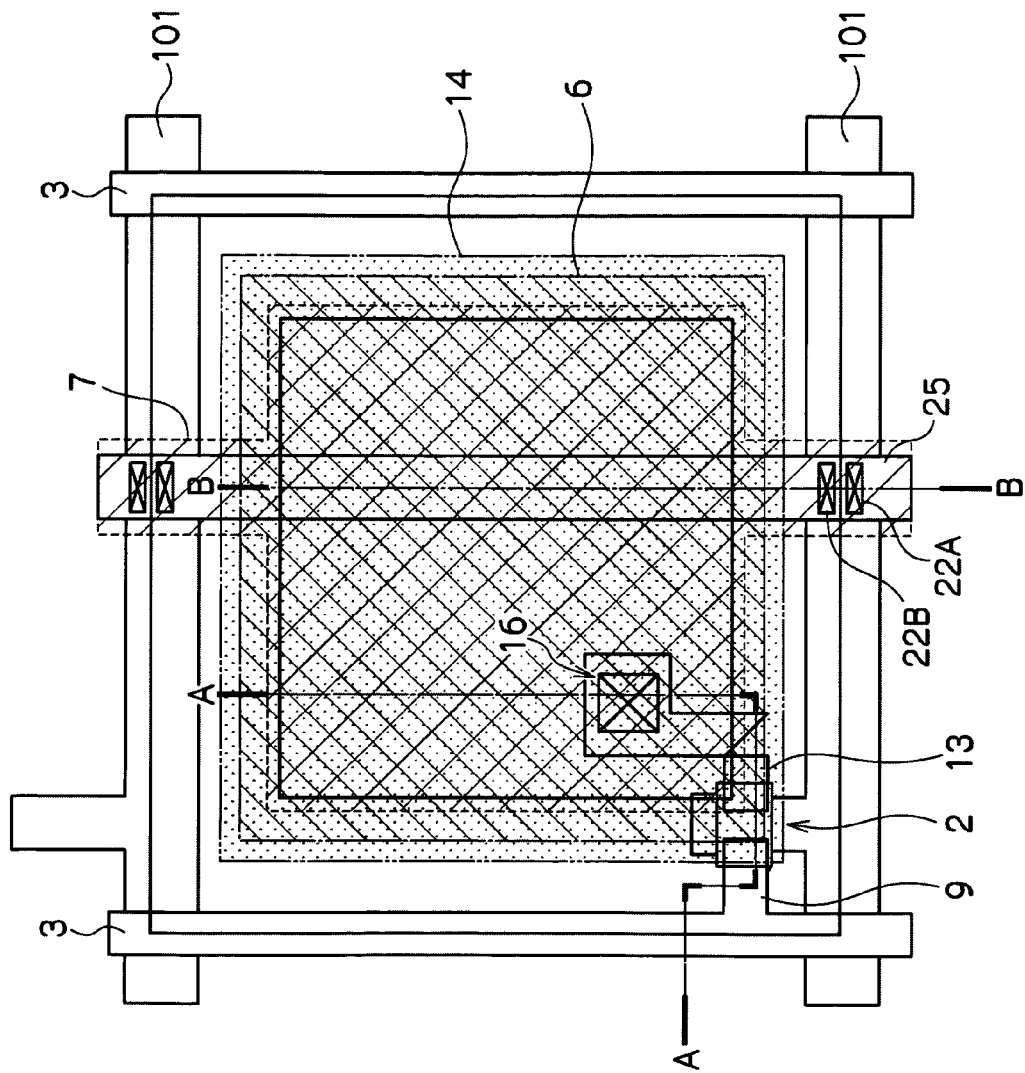
FIG. 17 is a plan view showing the structure of one pixel unit of an electromagnetic wave detecting element relating to a third exemplary embodiment.
Figure 18A:
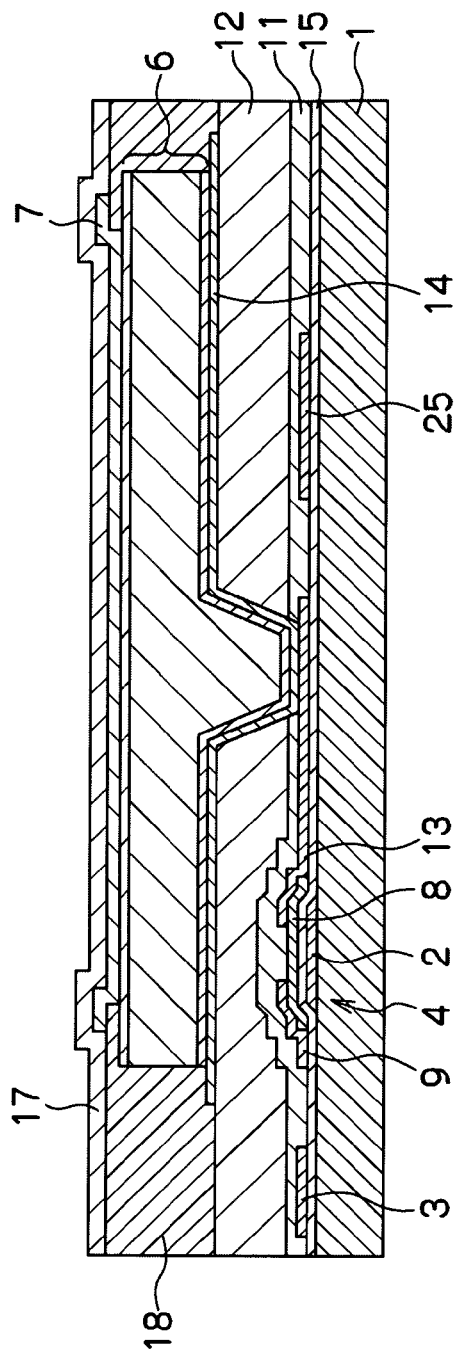
FIG. 18A and FIG. 18B are line cross-sectional views of the electromagnetic wave detecting element relating to the third exemplary embodiment.
Figure 18B:
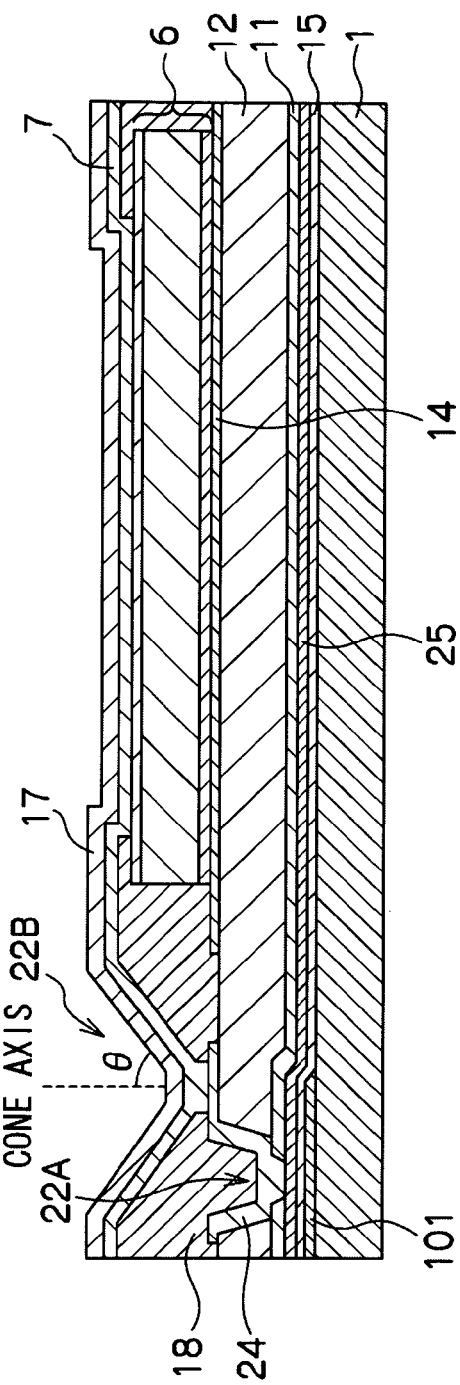

A plan view showing the structure of one pixel unit of the electromagnetic wave detecting element 10 relating to the third exemplary embodiment is shown in FIG. 17. Further, a cross-sectional view along line A-A of FIG. 17 is shown in FIG. 18A, and a cross-sectional view along line B-B of FIG. 17 is shown in FIG. 18B. Descriptions of portions in FIG. 17 and FIG. 18, that are the same as in FIG. 2 and FIG. 3, are omitted.

As shown in FIG. 18A and FIG. 18B, at the electromagnetic wave detecting element 10, the coating-type interlayer insulating film 18 is formed on the interlayer insulating film 12, so as to cover the outer peripheries of the respective semiconductor layer 6 while having openings at the respective semiconductor layer 6 portions. In the same way as the interlayer insulating film 12, the interlayer insulating film 18 is formed of a photosensitive organic material having low permittivity, and is thicker than the semiconductor layer 6 of the sensor portions 103, and is formed to a film thickness of 1 to 4 μm.

The contact holes 22B are formed in the interlayer insulating film 18, respectively at the positions of the contact pads 24. Note that, in the present exemplary embodiment, the contact hole 22B is formed in a conical shape (a taper shape) at which the diameter becomes smaller in the direction of thickness. As shown in FIG. 18B, the contact hole 22B is formed such that an angle θ of the inner surface with respect to the cone axis is less than or equal to 60°, and is greater than the angle with respect to the perpendicular direction of the edge of the semiconductor layer 6.

The upper electrodes 7 are formed on the semiconductor layer 6 and the interlayer insulating film 18, so as to cover at least the opening portion of the interlayer insulating film 18. The upper electrodes 7 also serves as an electrically-conductive member that is connected to the common electrode lines 25 that are disposed at the lower layer for supplying bias voltage to the upper electrodes 7. The common electrode lines 25 are connected, via the contact holes 22A provided in the first interlayer insulating film 12, to the contact pads 24 that is formed at the layer of the lower electrodes 14. Further, the upper electrodes 7 and the common electrode lines 25 are electrically connected by covering the contact holes 22B, that is provided in the interlayer insulating film 18, by the upper electrodes 7.

Moreover, the protective insulating film 17 is formed on substantially the entire surfaces of the interlayer insulating film 18 and the upper electrodes 7.

The scintillator 30 formed of GOS or the like is affixed to the electromagnetic wave detecting element 10 that is formed in this way, by using the adhesive resin 28 having low light absorbance, or the like.

Next, an example of the processes of fabricating the electromagnetic wave detecting element 10 relating to the third exemplary embodiment will be described with reference to FIG. 19A through FIG. 19I. Note that, because FIG. 19A through FIG. 19G are the same portions as FIG. 5A through FIG. 5G description thereof is omitted. Further, with regard to the materials, the film thicknesses and the methods of forming the respective layers, description of portions that are the same as in the first exemplary embodiment is omitted.

Figure 19A:
FIG. 19A through FIG. 19I are drawings for explaining processes of fabricating the electromagnetic wave detecting element relating to the third exemplary embodiment.
Figure 19B:
Figure 19C:
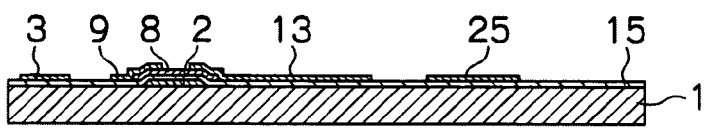
Figure 19D:
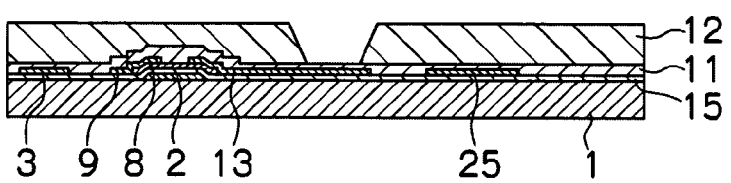
Figure 19E:
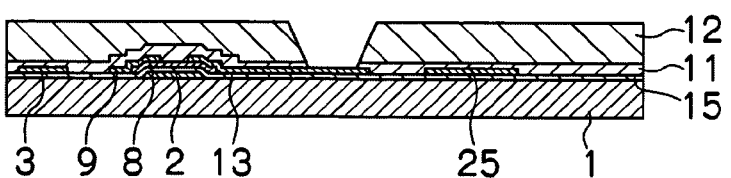
Figure 19F:
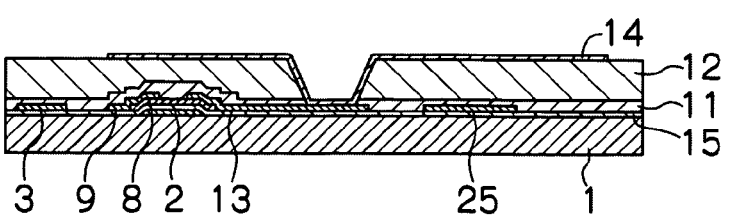
Figure 19G:
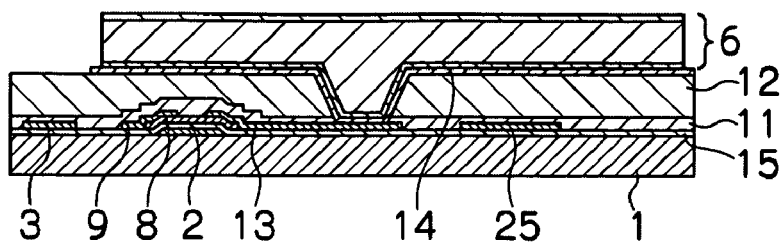
Figure 19H:
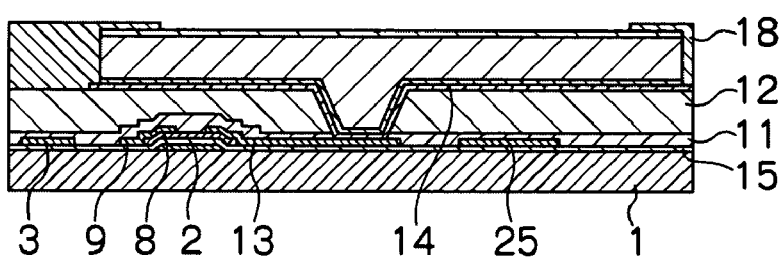

The interlayer insulating film 18 is successively formed on the interlayer insulating film 12 (FIG. 19H). In the same way as at the time of forming the interlayer insulating film 12, the interlayer insulating film 18 is formed by coating a material that is photosensitive and is a coating material, and after pre-baking, carrying out the steps of exposure and developing, and thereafter, carrying out baking, and forming the contact holes 22B as well.

Figure 19I:
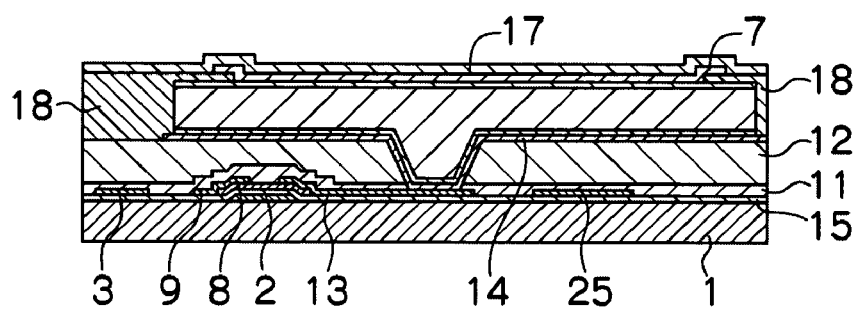

Then, in the same way as the structure of the first exemplary embodiment, the connection regions of the upper electrodes 7 and the common electrode lines 25 are formed on the interlayer insulating film 18. Thereafter, the protective insulating film 17 is formed on substantially the entire surface of the upper electrodes 7 (FIG. 19I).

By further providing the interlayer insulating film 18 as in the present exemplary embodiment, the angle θ of the inner surface of the contact hole 22B can be made to be gentle as shown in FIG. 18B. Therefore, the occurrence of disconnection or the like of the connected portions of the upper electrodes 7 and the common electrode lines 25 can be suppressed. In particular, in cases in which IZO or ITO is used as the upper electrodes 7, it is easy for disconnection due to changes in the steep angle, cracking or the like, to arise. Therefore, utilizing a structure such as that of the present third exemplary embodiment is effective.

Further, if the moisture permeability is high and moisture within the air penetrates in, leak current from the semiconductor layer 6 increases, and the device characteristics of the electromagnetic wave detecting element 10 may change. By covering the interlayer insulating film 18 with the protective insulating film 17 as in the present third exemplary embodiment, moisture within the air penetrating into the interlayer insulating film 18 can be suppressed.

The third exemplary embodiment describes a case in which the interlayer insulating film 18 is provided at the peripheries of the respective semiconductor layer 6. However, the interlayer insulating film 18 may be provided so as to cover the top surfaces of the respective semiconductor layer 6, and contact holes may be formed at the top surfaces of the respective semiconductor layer 6.

Figure 20A:
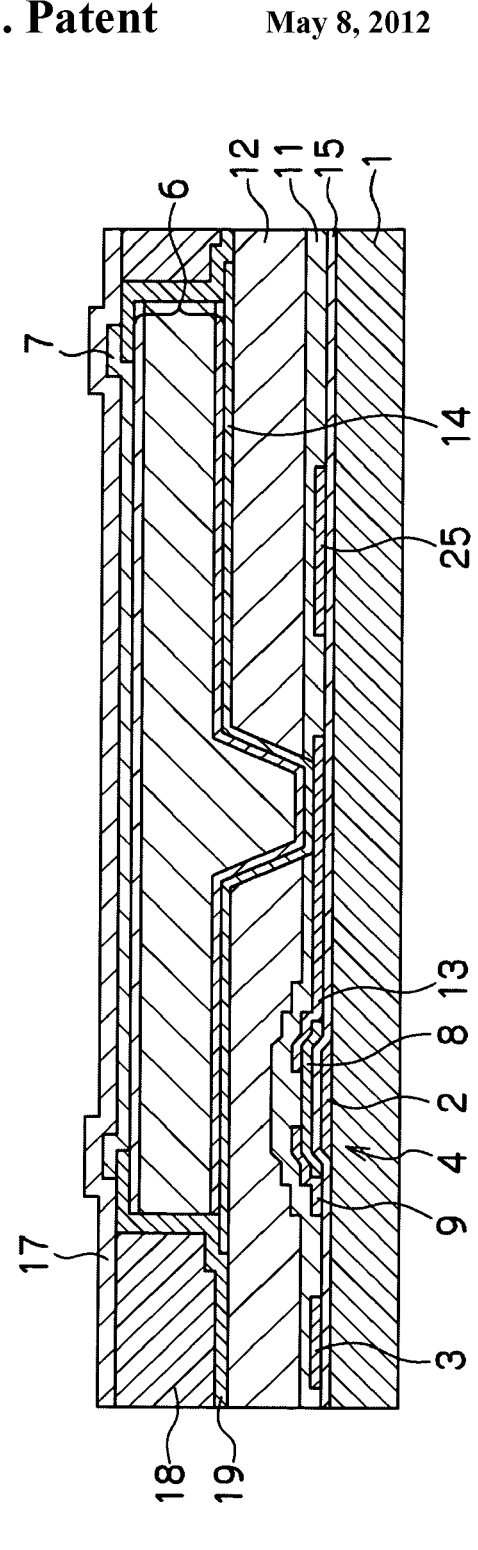
FIG. 20A and FIG. 20B are line cross-sectional views showing another example of the electromagnetic wave detecting element relating to the third exemplary embodiment.
Figure 20B:
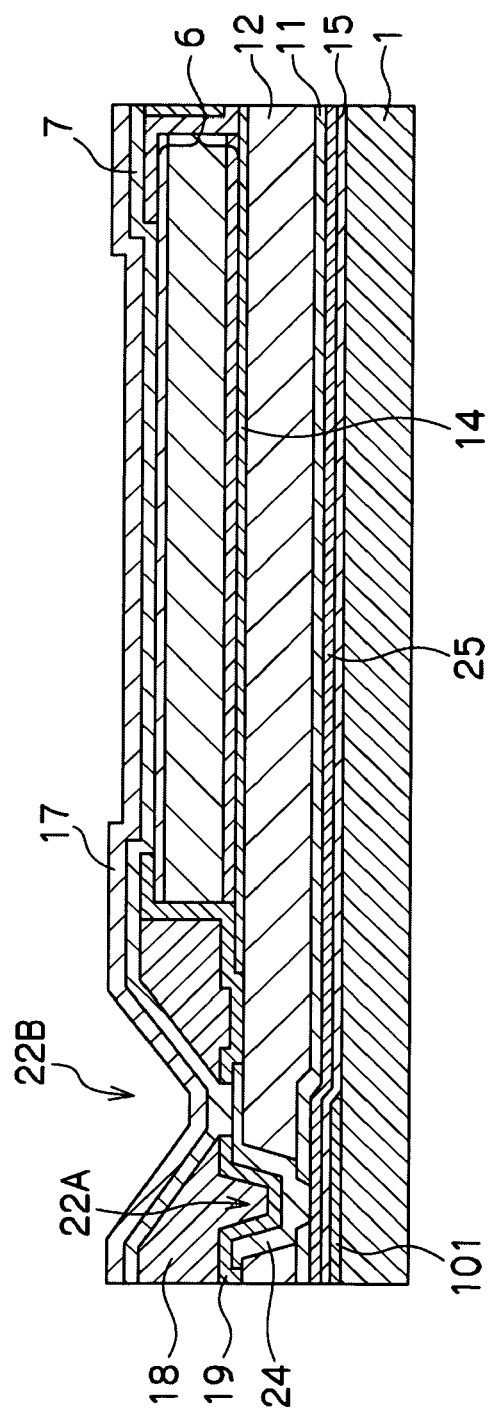

Further, in the above-described third exemplary embodiment, a protective insulating film 19 may be formed between the interlayer insulating film 12 and the interlayer insulating film 18 as shown in FIG. 20A and FIG. 20B. This case can be realized by forming the interlayer insulating film 19 that is formed from an inorganic material by CVD, for example, on the interlayer insulating film 12 and the semiconductor layer 6 that are formed in the process of FIG. 19G and thereafter, carrying out the process of above-described FIG. 19H so as to form the interlayer insulating film 18, and patterning the protective insulating film 19 at the contact hole 22B portions and the portions of connection with the upper electrodes 7 by a photolithographic technique. Due thereto, at the time of forming the contact holes 22B in the interlayer insulating film 18, the residue that is generated within the contact holes 22B can be removed at the time of patterning the protective insulating film 19.

Further, in accordance with the above-described respective exemplary embodiments, the contact holes that connect the upper electrodes 7 and the common electrode lines 25 (the contact holes 22A, 22B in the first and third exemplary embodiments, and the contact holes 22A, 22B, 22C in the second exemplary embodiment) are disposed between adjacent sensor portions 103. Therefore, a decrease in the surface area of the light-receiving regions of the sensor portions 103 (the fill factor) can be prevented.

Usually, the sensor portions 103 are separated at the positions of the signal lines 3 and the scan lines 101, in order to decrease the wiring loads of the signal lines 3 and the scan lines 101. Accordingly, the contact holes are disposed above the signal lines 3 or above the scan lines 101. However, in order to decrease image detecting noise, it is preferable that the contact holes be disposed above the scan lines 101.

In accordance with the above-described respective exemplary embodiments, the common electrode lines 25 are formed at the non-irradiation surface side of the lower electrode 14, via the insulating films (the TFT protecting film layer 11 and the interlayer insulating film 12 in the first and third exemplary embodiments, and the TFT protecting film layers 11A, 11B and the interlayer insulating film 12 in the second exemplary embodiment). Therefore, the capacity between the lower electrodes 14 and the common electrode lines 25 decreases, and the switching noise of the TFT switches 4 can be decreased. Namely, the switching noise increases proportionately to the capacity. For example, in a case in which the insulating film is SiNx or the like, there are limits of around 7 for the dielectric constant and around 0.5 μm for the film thickness. Therefore, the capacity between the lower electrode 14 and the common electrode line 25 is large. Thus, by providing the interlayer insulating film 12 (e.g., permittivity 3.5, film thickness 2 μm) as in the present exemplary embodiment, the capacity becomes, for example, ⅛. Accordingly, the capacity is small as compared with the capacity of the sensor portion 103, and the switching noise is of an extent that can be ignored.

Further, in accordance with the above-described respective exemplary embodiments, the common electrode lines 25 are formed parallel to the signal lines 3. Therefore, the signal lines 3 do not intersect the common electrode lines 25. Accordingly, an increase in the electrostatic capacity of the lines due to the signal lines 3 and the common electrode lines 25 intersecting can be prevented. Thus, electronic noise that is generated at the signal lines 3 can be reduced.

Moreover, in accordance with the above-described respective exemplary embodiments, portions of the upper electrode 7 extend along the signal line 3, and are connected to the upper electrodes 7 of the other pixels that are adjacent along the signal line 3 so as to elongate the common electrode line 25. Due thereto, even in a case in which poor contact arises at a contact hole that connects the upper electrode 7 and the common electrode line 25, bias voltage can be applied to the upper electrode 7 from the adjacent pixels. Therefore, poor operation of the sensor portion 103 can be suppressed.

Figure 10:
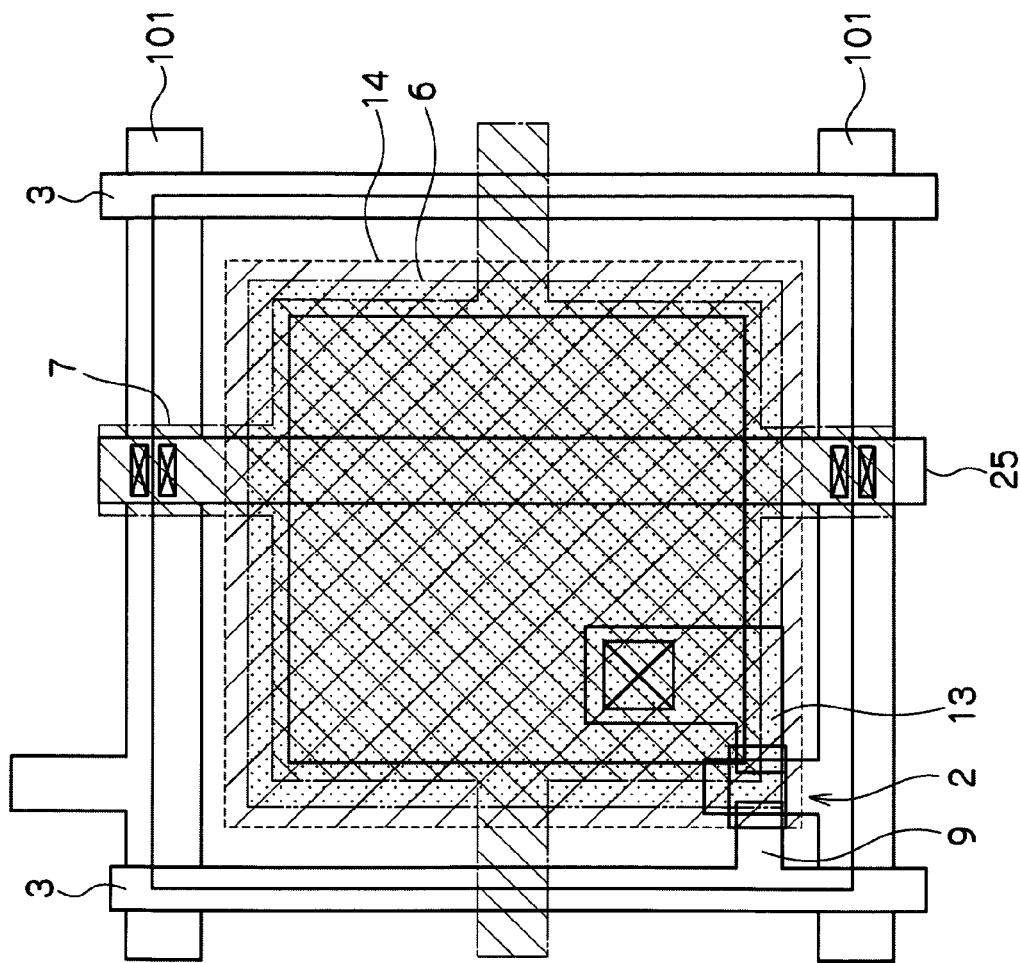
FIG. 10 is a plan view showing the structure of one pixel unit of an electromagnetic wave detecting element relating to another exemplary embodiment.

Note that the above-described respective exemplary embodiments describe cases in which the upper electrode 7 is connected to the upper electrodes 7 of the other pixels that are adjacent along the signal line 3. However, the present invention is not limited to the same. For example, as shown in FIG. 10, the upper electrode 7 may be also be connected to the upper electrodes 7 of the other pixels that are adjacent along the scan line 101. Due thereto, the occurrence of artifacts caused by the electrode potential distribution along the scan line 101 direction can be suppressed. Note that, it is possible for the upper electrode 7 to be connected to only the upper electrodes 7 of the other pixels that are adjacent along the scan line 101.

Figure 11:
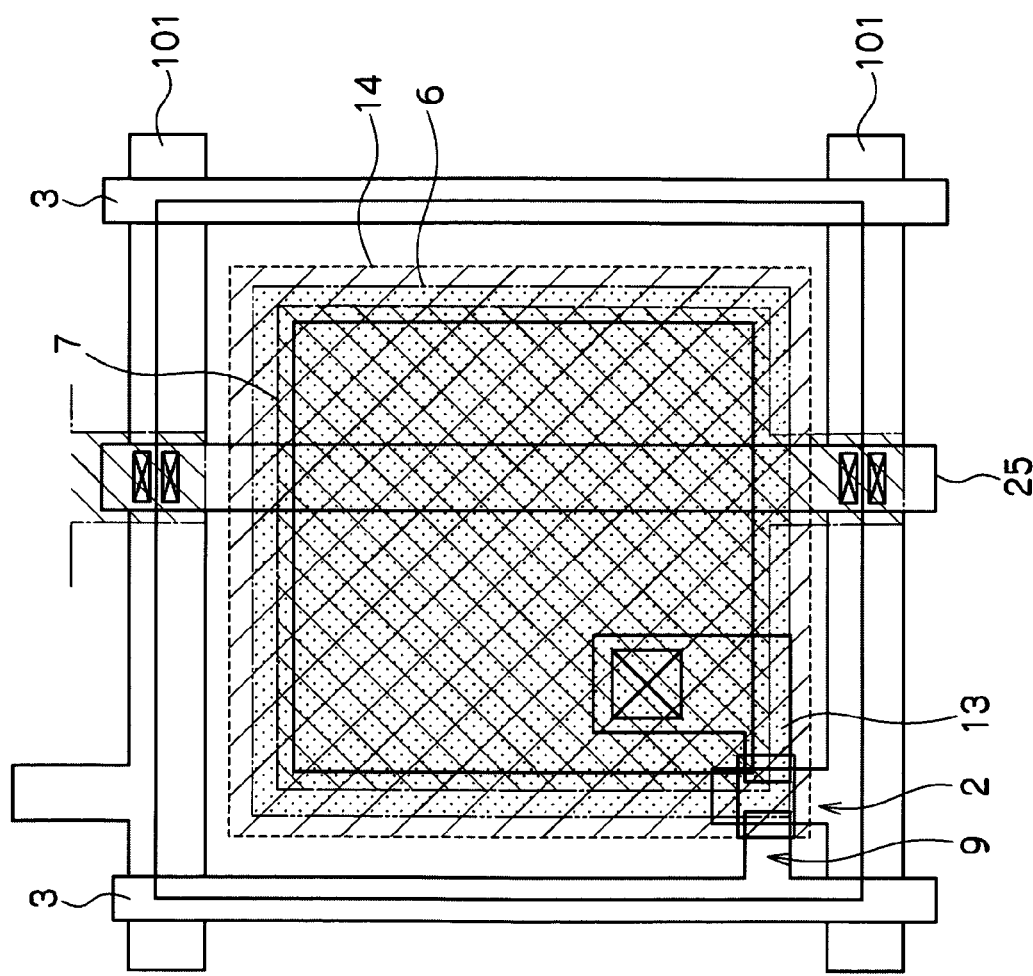
FIG. 11 is a plan view showing the structure of one pixel unit of an electromagnetic wave detecting element relating to yet another exemplary embodiment.

Further, as shown in FIG. 11, the upper electrode 7 may be made to be independent and not connected to the upper electrodes 7 of other pixels.

Figure 12:
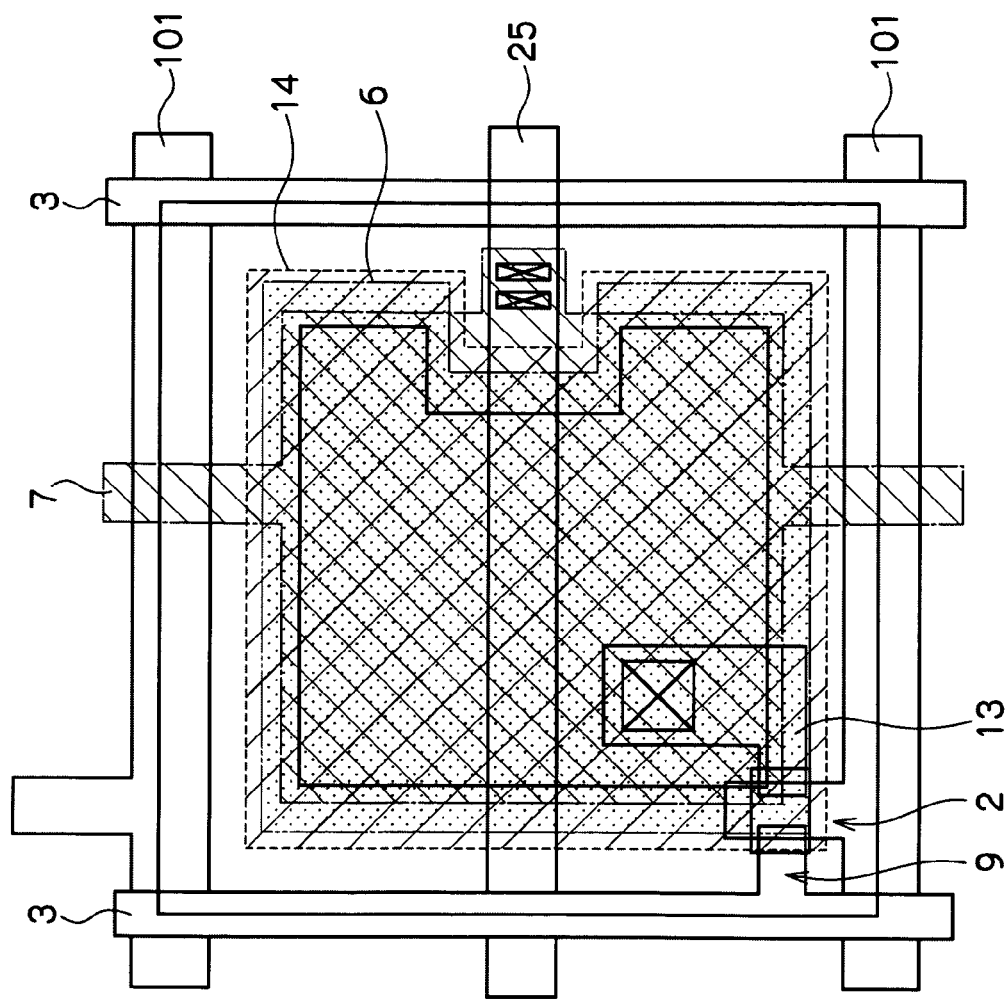
FIG. 12 is a plan view showing the structure of one pixel unit of an electromagnetic wave detecting element relating to still another exemplary embodiment.
Figure 13:
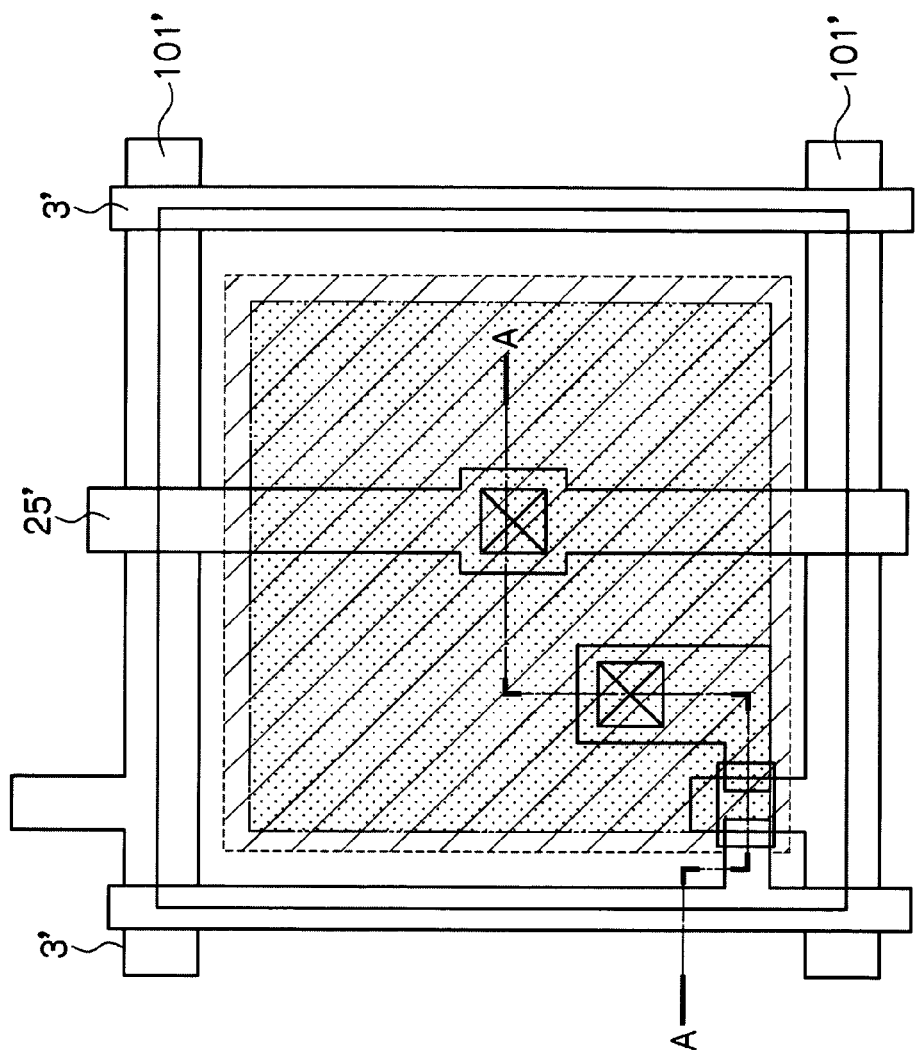
FIG. 13 is a plan view showing the structure of one pixel unit of a conventional electromagnetic wave detecting element.
Figure 14:
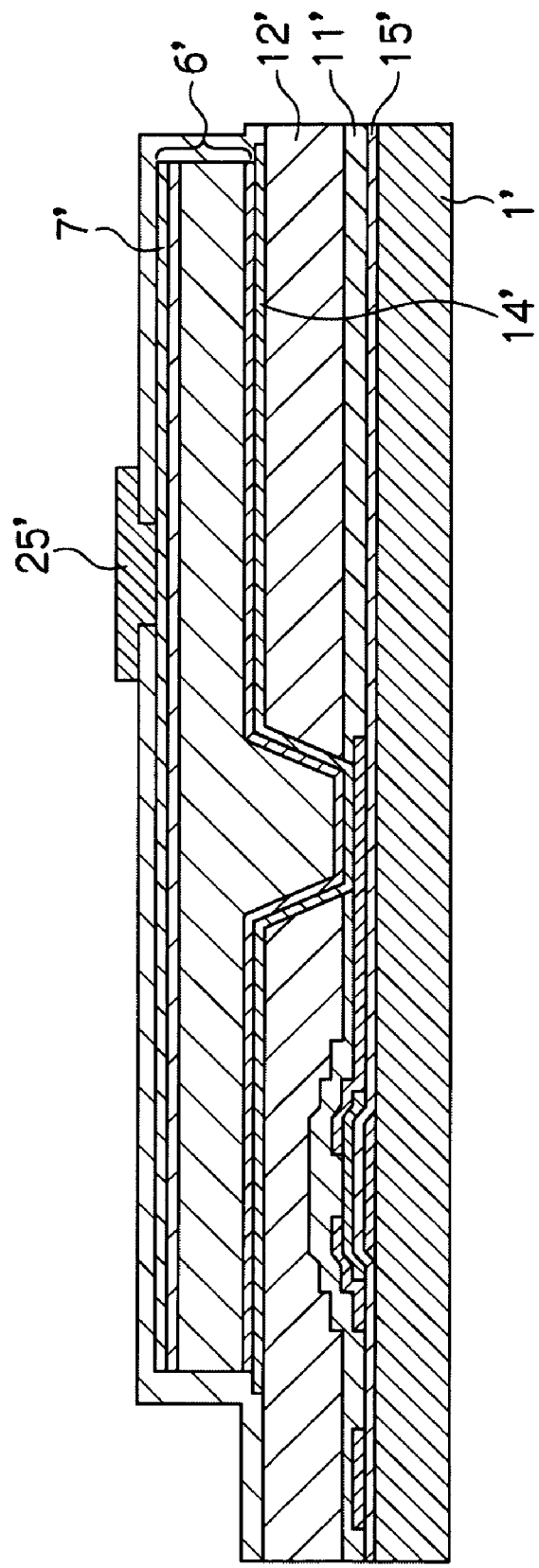
FIG. 14 is a line cross-sectional view of the conventional electromagnetic wave detecting element.

The above respective exemplary embodiments describe cases in which the common electrode lines 25 are formed in parallel to the signal lines 3. However, the present invention is not limited thereto. For example, as shown in FIG. 12, the common electrode lines 25 may be formed parallel to the scan lines 101.

Further, the above respective exemplary embodiments describe cases in which the present invention is applied to the indirect-conversion-type electromagnetic wave detecting element 10 that once converts radiation into light at the scintillator 30, and converts the converted light into charges at the semiconductor layer 6 and accumulates the charges. However, the present invention is not limited thereto, and may be applied to, for example, a direct-conversion-type electromagnetic wave detecting element that directly converts radiation into charges at a semiconductor layer of amorphous silicon or the like, and accumulates the charges.

In the indirect-conversion-type electromagnetic wave detecting element 10, radiation is converted into light at the scintillator 30, and the light converted at the scintillator 30 is received, and charges are accumulated at the sensor portions 103. Therefore, in the case of an indirect-conversion-type electromagnetic wave detecting element, the electromagnetic waves, that express the image that is the object of detection of the sensor portions of the present invention, are light. Further, at the electromagnetic wave detecting element 10 relating to the present exemplary embodiment, even in a case in which radiation is irradiated from the substrate 1 side, the radiation is converted into light at the scintillator 30, the converted light is illuminated onto the sensor portion 103, and charges are generated at the semiconductor layer 6. Therefore, even in a case in which radiation is irradiated from the substrate 1 side, the irradiation surface side of the semiconductor layer 6, at which the electromagnetic waves that are the object of detection are irradiated, is the scintillator 30 side, and the non-irradiation surface side is the substrate 1 side.

On the other hand, in a direct-conversion-type electromagnetic wave detecting element, radiation is converted directly into charges at a semiconductor layer. Thus, in a direct-conversion-type electromagnetic wave detecting element, the electromagnetic waves, that express the image that is the object of detection of the sensor portion of the present invention, are radiation. Further, in the case of a direct-conversion-type electromagnetic wave detecting element, the radiation is converted directly into charges at the semiconductor layer. Therefore, the irradiation surface side of the semiconductor layer, at which the electromagnetic waves are irradiated, is the side at which the radiation is irradiated, and the non-irradiation surface side is the side at which radiation is not irradiated. For example, if radiation is irradiated from the substrate side, the irradiation surface side of the semiconductor layer, at which the electromagnetic waves are irradiated, is the substrate side, and the non-irradiation surface side is the side of the semiconductor layer that is opposite the side where the substrate is located.

Moreover, the above respective exemplary embodiments describe cases in which the present invention is applied to the radiation image detection device 100 that detects an image by detecting X-rays as the electromagnetic waves that are the object of detection. However, the present invention is not limited thereto. The electromagnetic waves that are the object of detection may be, for example, any of visible light, ultraviolet rays, infrared rays, and the like.

In addition, the structure (see FIG. 1) of the radiation image detection device 100 described in the respective exemplary embodiments and the structures (FIG. 2 through FIG. 12) of the electromagnetic wave detecting elements 10 are examples, and appropriate changes can be made thereto within a scope that does not deviate from the gist of the present invention.

What is claimed is:

1. An electromagnetic wave detecting element comprising:
a plurality of sensor portions, each of the sensor portions having:
    a semiconductor layer provided in correspondence with intersecting portions of one of a plurality of scan lines and one of a plurality of signal lines that are disposed so as to intersect one another, the semiconductor layer generating charges by being irradiated by electromagnetic waves expressing an image that is an object of detection,
    a first electrode formed by an electrically-conductive member that has transmittance with respect to the electromagnetic waves, at an irradiation surface side of the semiconductor layer to which the electromagnetic waves are irradiated, the first electrode applying bias voltage to the semiconductor layer, and
    a second electrode formed at a non-irradiation surface side of the semiconductor layer with respect to the electromagnetic waves, the second electrode collecting the charges that are generated at the semiconductor layer; and
a common electrode line formed at an electromagnetic wave downstream side of the sensor portions, and connected to each of the first electrodes via respective contact holes, and supplying the bias voltage;
a first insulating film provided between the plurality of sensor portions and the common electrode line and insulating the plurality of sensor portions and the common electrode line, the respective contact holes being formed in the first insulating film; and
a plurality of contacts whose respective one ends are connected to the first electrodes via the contact holes respectively, and whose other ends are connected to the common electrode line.

2. The electromagnetic wave detecting element of claim 1, wherein the common electrode line has low resistance compared to the electrically-conductive members that form the first electrodes.

3. The electromagnetic wave detecting element of claim 2, wherein the common electrode line is Al or Cu, or is an alloy or a layered film comprising Al or Cu.

4. The electromagnetic wave detecting element of claim 1, wherein the scan lines are formed by a wiring layer that is formed at an electromagnetic wave downstream side, via a second insulating film, of a wiring layer at which the common electrode line is formed, and contact holes are formed in the first insulating film at positions at the irradiation surface sides of regions where the scan lines are formed.

5. The electromagnetic wave detecting element of claim 1, wherein the first insulating film is an interlayer insulating film whose film thickness is greater than or equal to 1 µm.

6. The electromagnetic wave detecting element of claim 1, wherein the first insulating film is an interlayer insulating film whose dielectric constant is 2 to 4.

7. The electromagnetic wave detecting element of claim 1, further comprising a third insulating film that covers at least outer peripheries of the plurality of sensor portions, and in which a plurality of contact holes are formed, wherein one ends of a plurality of contacts are connected to the first electrodes via the contact holes that are formed in the first insulating film and the third insulating film respectively, and other ends of the plurality of contacts are connected to the common electrode line.

8. The electromagnetic wave detecting element of claim 7, wherein the third insulating film is an interlayer insulating film whose film thickness is thicker than a film thickness of the sensor portions.

9. The electromagnetic wave detecting element of claim 7, further comprising a protective insulating film that is formed of an inorganic material and that covers the third insulating film, the contacts, and the first electrodes.

10. The electromagnetic wave detecting element of claim 7, further comprising a protective insulating film that is formed of an inorganic material between the first insulating film and the third insulating film.

11. The electromagnetic wave detecting element of claim 9, wherein the protective insulating film is an SiNx or SiOx film.

12. The electromagnetic wave detecting element of claim 1, wherein the contacts are formed from IZO or ITO.

13. The electromagnetic wave detecting element of claim 1, wherein the contacts are formed of a same member as the first electrodes.

14. An electromagnetic wave detecting element, comprising:

a plurality of sensor portions, each of the sensor portions having:

a semiconductor layer provided in correspondence with intersecting portions of one of a plurality of scan lines and one of a plurality of signal lines that are disposed so as to intersect one another, the semiconductor layer generating charges by being irradiated by electromagnetic waves expressing an image that is an object of detection, a first electrode formed by an electrically-conductive member that has transmittance with respect to the electromagnetic waves, at an irradiation surface side of the semiconductor layer to which the electromagnetic waves are irradiated, the first electrode applying bias voltage to the semiconductor layer, and a second electrode formed at a non-irradiation surface side of the semiconductor layer with respect to the electromagnetic waves, the second electrode collecting the charges that are generated at the semiconductor layer; and a common electrode line formed at an electromagnetic wave downstream side of the sensor portions, and connected to the first electrodes via respective contact holes, and supplying the bias voltage, wherein each of the first electrodes is electrically connected via connection regions to other adjacent first electrodes.

15. The electromagnetic wave detecting element of claim 14, wherein the connection regions are formed from electrically-conductive members having transmittance with respect to the electromagnetic waves.

16. The electromagnetic wave detecting element of claim 14, wherein the first electrodes are connected to other first electrodes that are adjacent along the signal line.

17. The electromagnetic wave detecting element of claim 14, wherein the first electrodes are connected to other first electrodes that are adjacent along the scan line.

* * * * *